United States Patent
Chen et al.

(10) Patent No.: US 11,715,802 B2
(45) Date of Patent: Aug. 1, 2023

(54) NANOWIRE STACK GAA DEVICE WITH INNER SPACER AND METHODS FOR PRODUCING THE SAME

(71) Applicant: Taiwan Semiconductor Manufacturing Co., Ltd., Hsinchu (TW)

(72) Inventors: I-Sheng Chen, Taipei (TW); Chao-Ching Cheng, Hsinchu (TW); Tzu-Chiang Chen, Hsinchu (TW); Carlos H Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 108 days.

(21) Appl. No.: 17/181,315

(22) Filed: Feb. 22, 2021

(65) Prior Publication Data
US 2021/0175367 A1    Jun. 10, 2021

Related U.S. Application Data

(63) Continuation of application No. 16/598,750, filed on Oct. 10, 2019, now Pat. No. 10,930,795, which is a continuation of application No. 16/235,987, filed on Dec. 28, 2018, now Pat. No. 10,651,314.

(60) Provisional application No. 62/690,267, filed on Jun. 26, 2018.

(51) Int. Cl.
*H01L 29/786* (2006.01)
*H01L 29/423* (2006.01)
*H01L 29/66* (2006.01)
*H01L 29/06* (2006.01)
*H01L 27/092* (2006.01)

(52) U.S. Cl.
CPC .... *H01L 29/78696* (2013.01); *H01L 29/0673* (2013.01); *H01L 29/42392* (2013.01); *H01L 29/66553* (2013.01); *H01L 29/66742* (2013.01); *H01L 27/092* (2013.01)

(58) Field of Classification Search
CPC ........... H01L 29/78696; H01L 29/0673; H01L 29/42392; H01L 29/66553; H01L 29/66598; H01L 29/66742; H01L 27/092
USPC ........................................................ 257/401
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |

(Continued)

*Primary Examiner* — Tu-Tu V Ho
(74) *Attorney, Agent, or Firm* — Slater Matsil, LLP

(57) ABSTRACT

A nanowire FET device includes a vertical stack of nanowire strips configured as the semiconductor body. One or more of the top nanowire strips are receded and are shorter than the rest of the nanowire strips stacked lower. Inner spacers are uniformly formed adjacent to the receded nanowire strips and the rest of the nanowire strips. Source/drain structures are formed outside the inner spacers and a gate structure is formed inside the inner spacers, which wraps around the nanowire strips.

20 Claims, 28 Drawing Sheets

(56) References Cited

U.S. PATENT DOCUMENTS

| | | |
|---|---|---|
| 9,881,993 B2 | 1/2018 | Ching et al. |
| 10,431,585 B2 | 10/2019 | Yang et al. |
| 10,461,194 B2 | 10/2019 | Leobandung |
| 2014/0151639 A1 | 6/2014 | Chang et al. |
| 2017/0040321 A1 | 2/2017 | Mitard |
| 2018/0175035 A1 | 6/2018 | Yang et al. |
| 2019/0326288 A1* | 10/2019 | Hashemi ........... H01L 29/42392 |

* cited by examiner

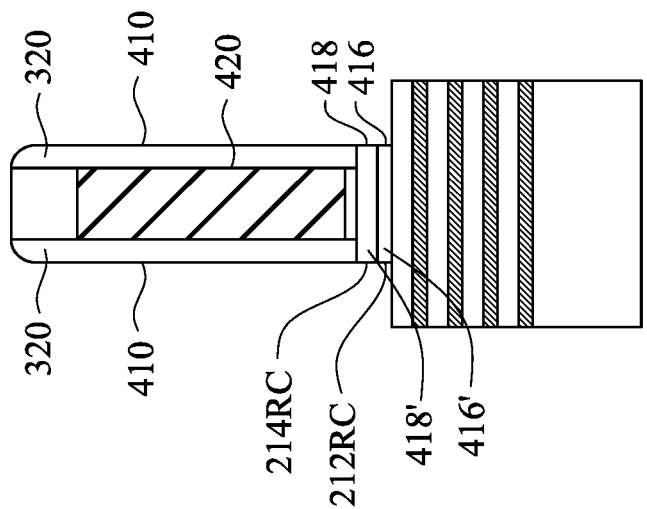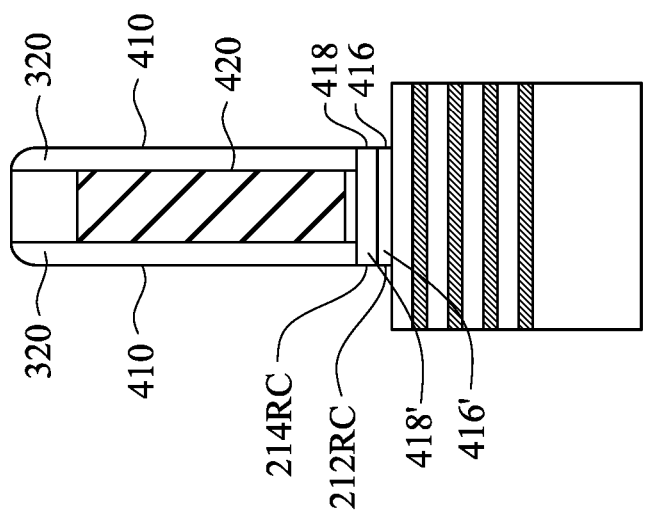

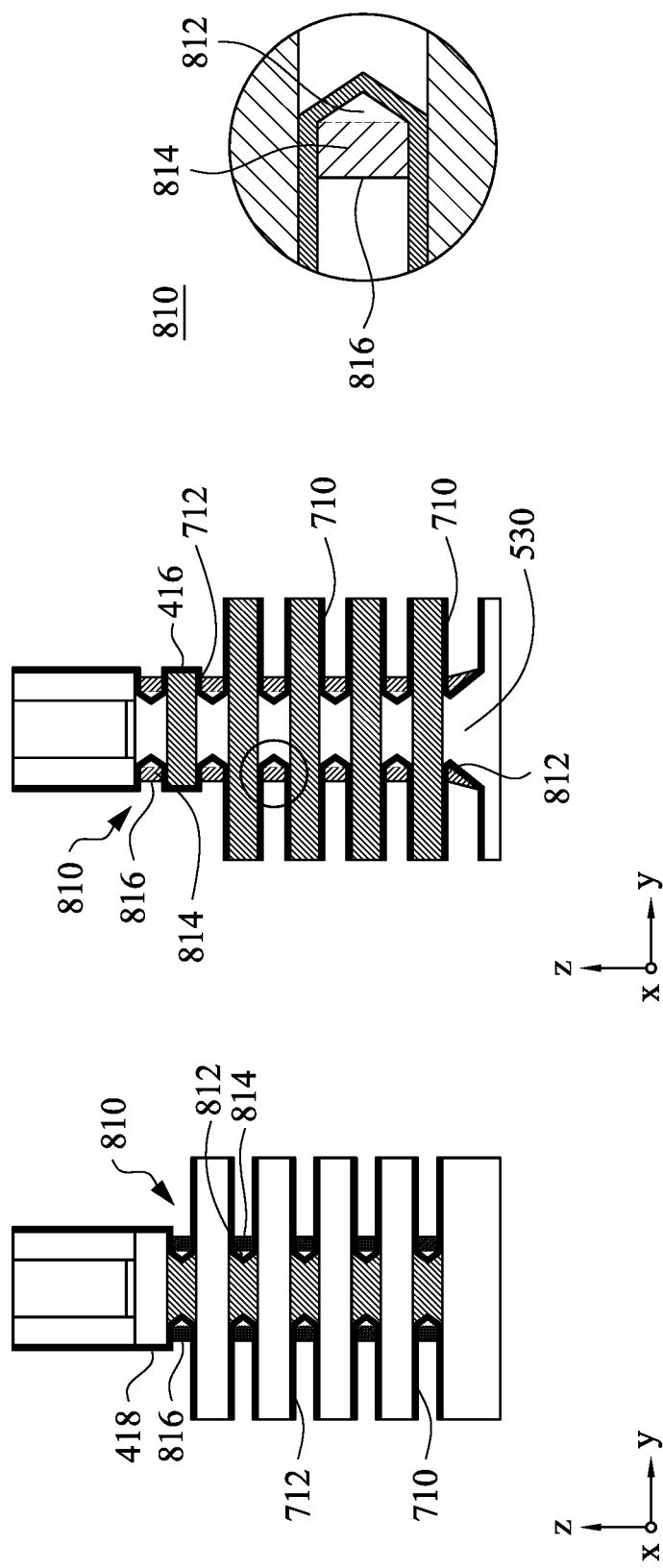

NANOWIRE STACK GAA DEVICE WITH INNER SPACER AND METHODS FOR PRODUCING THE SAME

PRIORITY CLAIM AND CROSS-REFERENCE

This application is a continuation of U.S. application Ser. No. 16/598,750, filed on Oct. 10, 2019, now U.S. Pat. No. 10,930,795 issued Feb. 23, 2021, which is a continuation of U.S. application Ser. No. 16/235,987, filed on Dec. 28, 2018, now U.S. Pat. No. 10,651,314 issued May 12, 2020, which claims the benefit of U.S. Provisional Application No. 62/690,267, filed on Jun. 26, 2018, each application is hereby incorporated herein by reference.

BACKGROUND

Complementary metal oxide semiconductor (CMOS) transistors are building blocks for integrated circuits. Faster CMOS switching speed requires higher drive current, which drives the gate lengths of CMOS transistors down. Shorter gate lengths lead to undesirable "short-channel effects," in which the current control functions of the gates are compromised. FinFET transistors have been developed to, among other things, overcome the short-channel effects. As a further step toward improving electrostatic control of the channels, transistors having wrapped-around gates have been developed, in which a gate portion may surround a semiconductor channel or channel strip from the upper surface and sidewalls thereof.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1B:
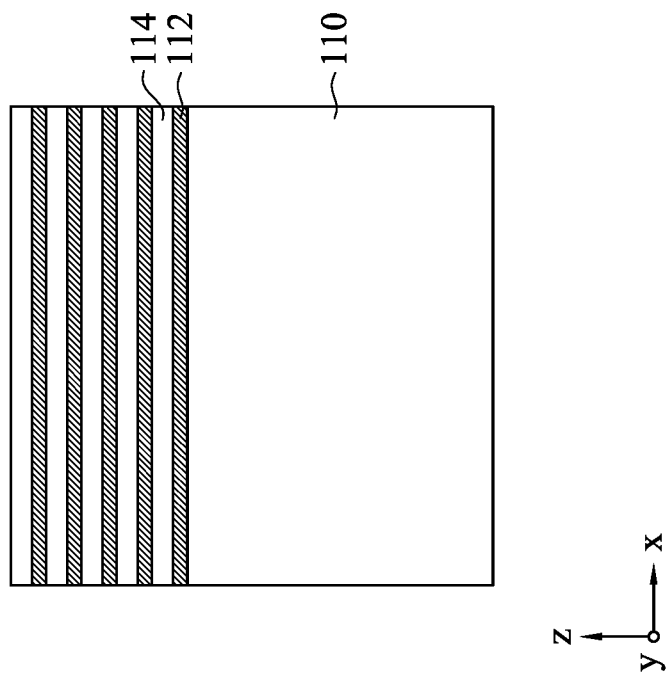
FIGS. 1A through 12D are perspective views and cross-sectional views of stages in the fabrication of a transistor(s) according to example embodiments of the disclosure.

The current disclosure describes techniques for forming partially receded source/drain structures in a lateral (or horizontal) nanowire field effect transistor. A stack of nanowire (one-dimensional) semiconductor strips are formed as semiconductor body regions. Sacrificial strips are also formed and stacked one-to-one with the semiconductor strips in an alternating sequence. A sacrificial gate structure (dummy gate) is formed over the stack of the nanowire semiconductor strips. One or more of the top nanowire semiconductor strips are receded, e.g., to be vertically in line, i.e., overlap, the outer spacer of the gate. The sacrificial strips are receded to be substantially vertically in line with the dummy gate and be shorter than the receded nanowire semiconductor strip(s). The edge surfaces of the receded sacrificial strips include a recessed profile, i.e., including indentations. Inner spacer structures are formed adjacent to the edge surfaces of the receded sacrificial strips and following the profiles of the recessed edge surfaces of the receded sacrificial strips. That is, the inner spacer structures each are also recessed toward the recessed edge surfaces of the receded sacrificial strips. Source/drain structures are formed adjacent to the nanowire semiconductor strips exposed from the inner spacer structures and adjacent to the inner spacer structures. At least due to the recessed profile of the inner spacer structures, a void(s) is formed between the source/drain structure and an inner spacer structure. The source/drain structure wraps around or surrounds portions of the nanowire semiconductor strips exposed from the inner spacer structures. The dummy gate and the sacrificial strips are then removed, leaving an open space. A replacement conductive gate is formed in the open space.

In the resultant device, one or more top semiconductor nanowire strips are receded to be shorter than the rest of the semiconductor nanowire strips. The inner spacer structures are uniformly formed adjacent to the receded semiconductor nanowire strips and the rest of the semiconductor nanowire strips which improves electrostatic performance of the devices. The voids between the inner spacers and the source/drain structure further improve electrostatic performance of the devices. Further, when the source/drain structure adjacent to the receded semiconductor nanowire strip is more heavily doped than other parts of the source/drain structure, the charge carrier mobility and the on-state current are further enhanced.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 13:
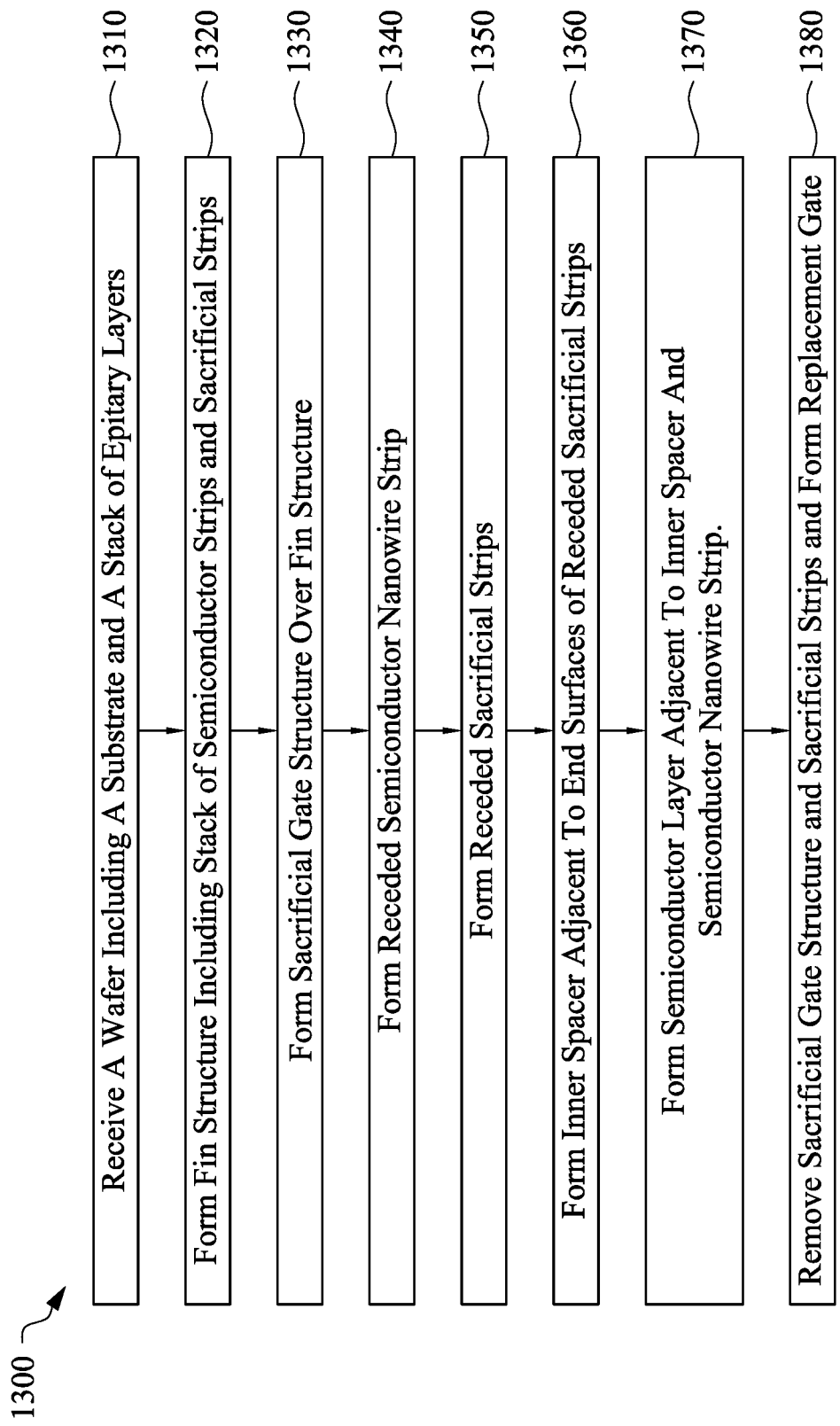
FIG. 13 illustrates an example fabrication process.

FIG. 13 is an example fabrication process 1300 in accordance with various embodiments of the present disclosure.

Figure 1A:
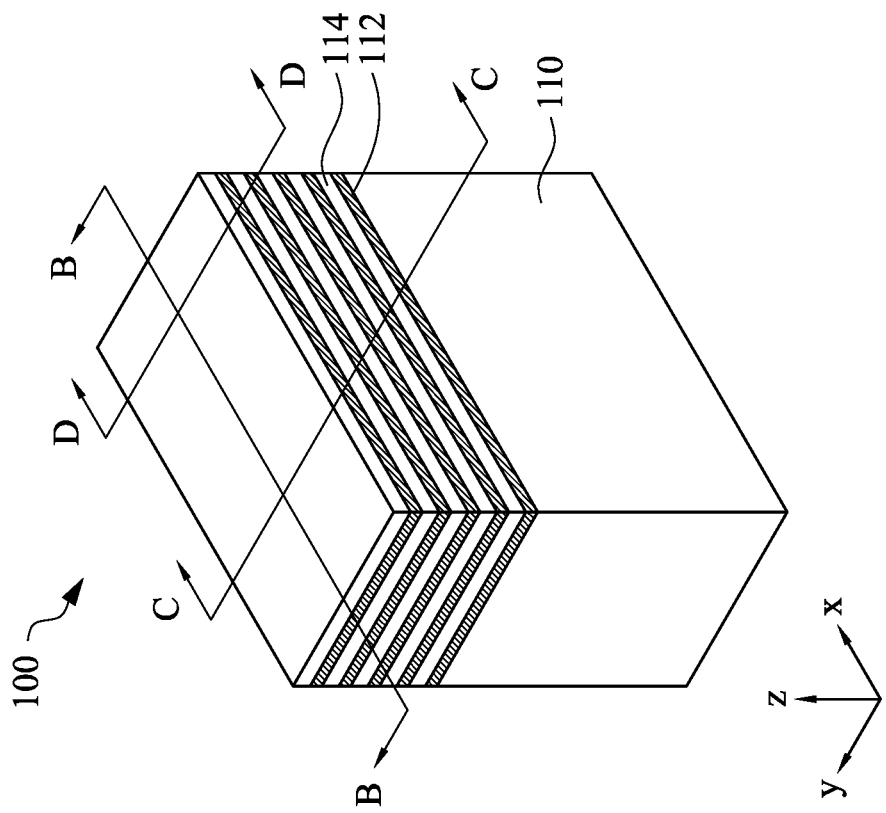
Figure 1C:
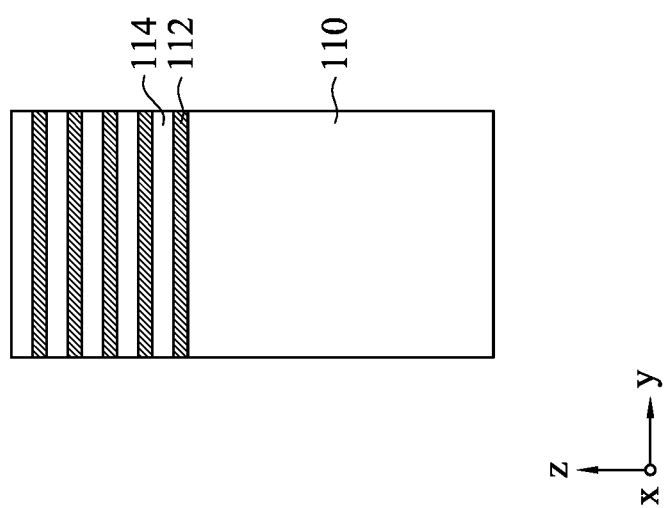
Figure 1D:
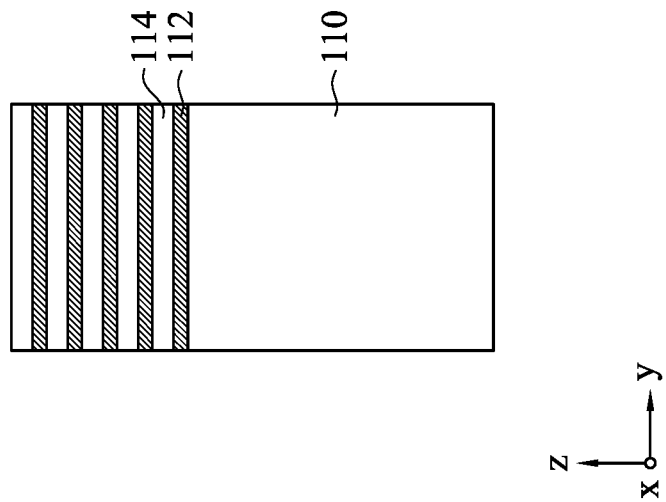
Figure 2B:
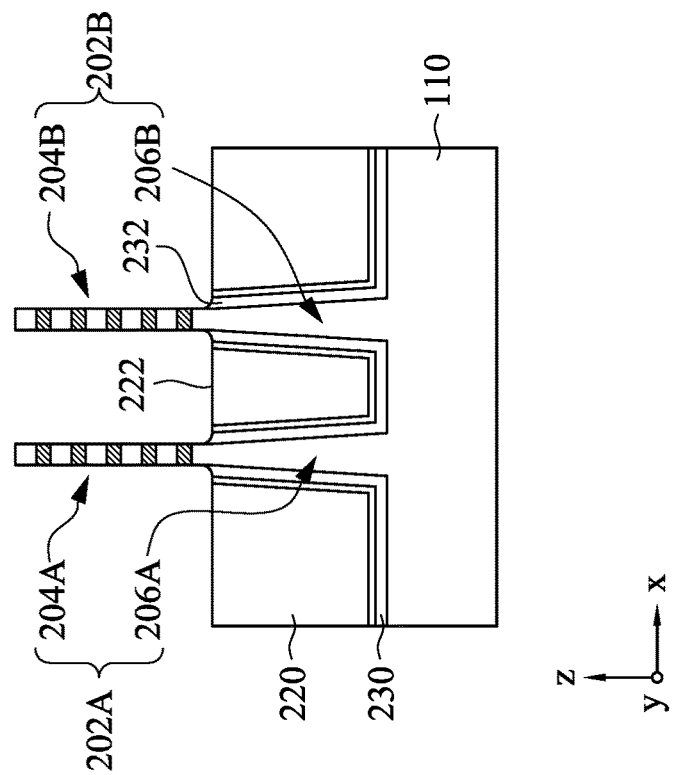
Figure 2A:
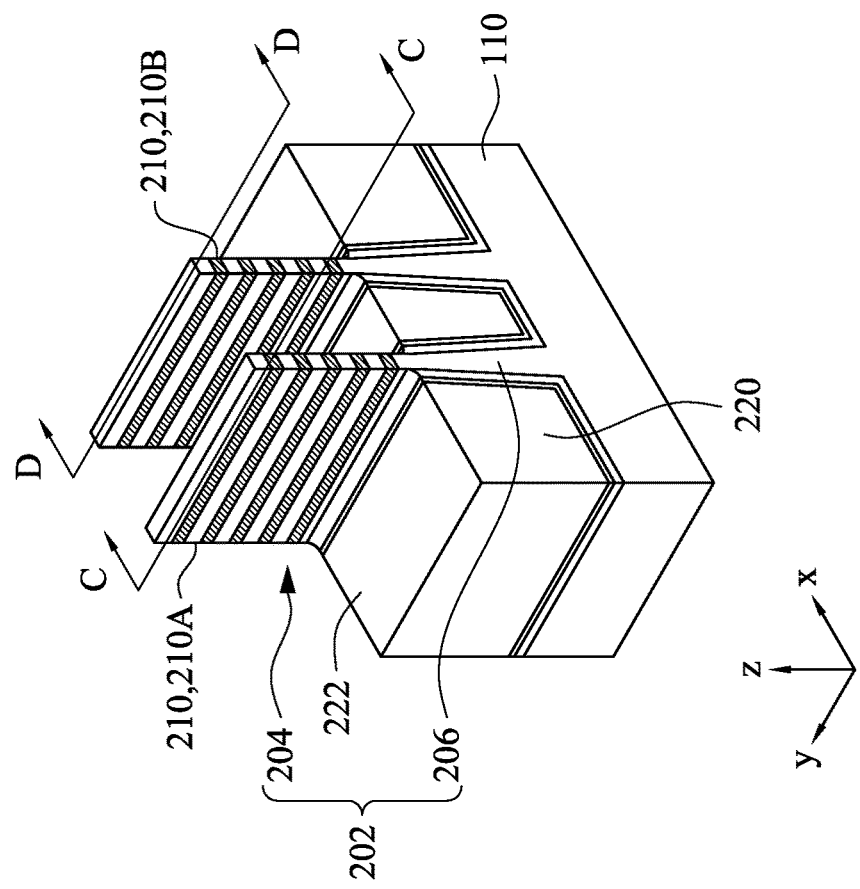
Figure 2C:
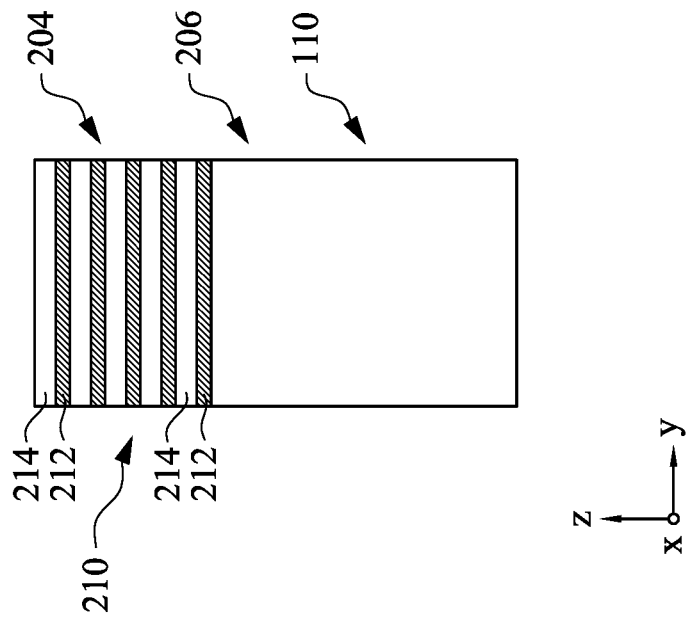
Figure 2D:
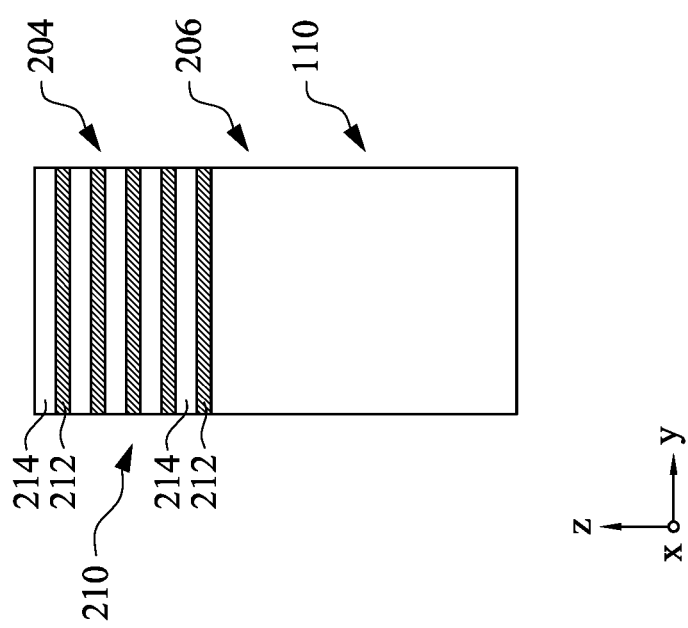
Figure 3B:
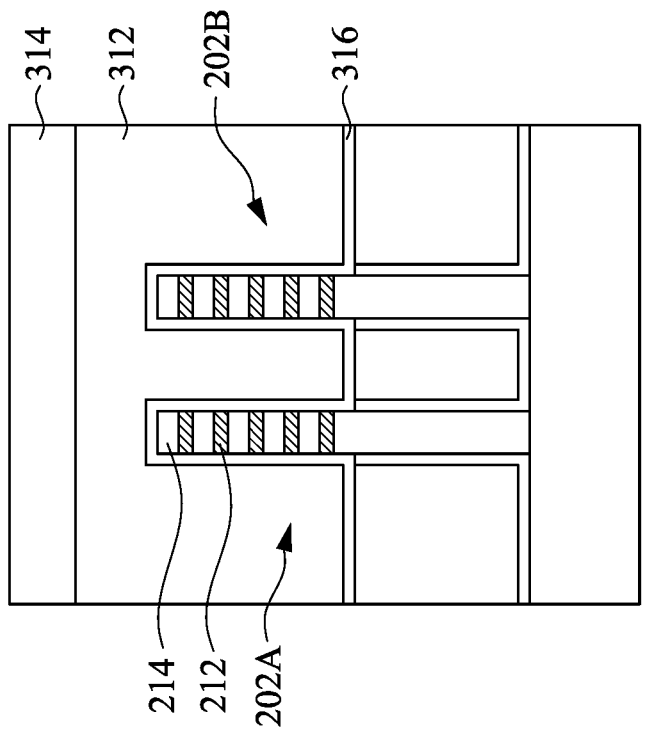
Figure 3A:
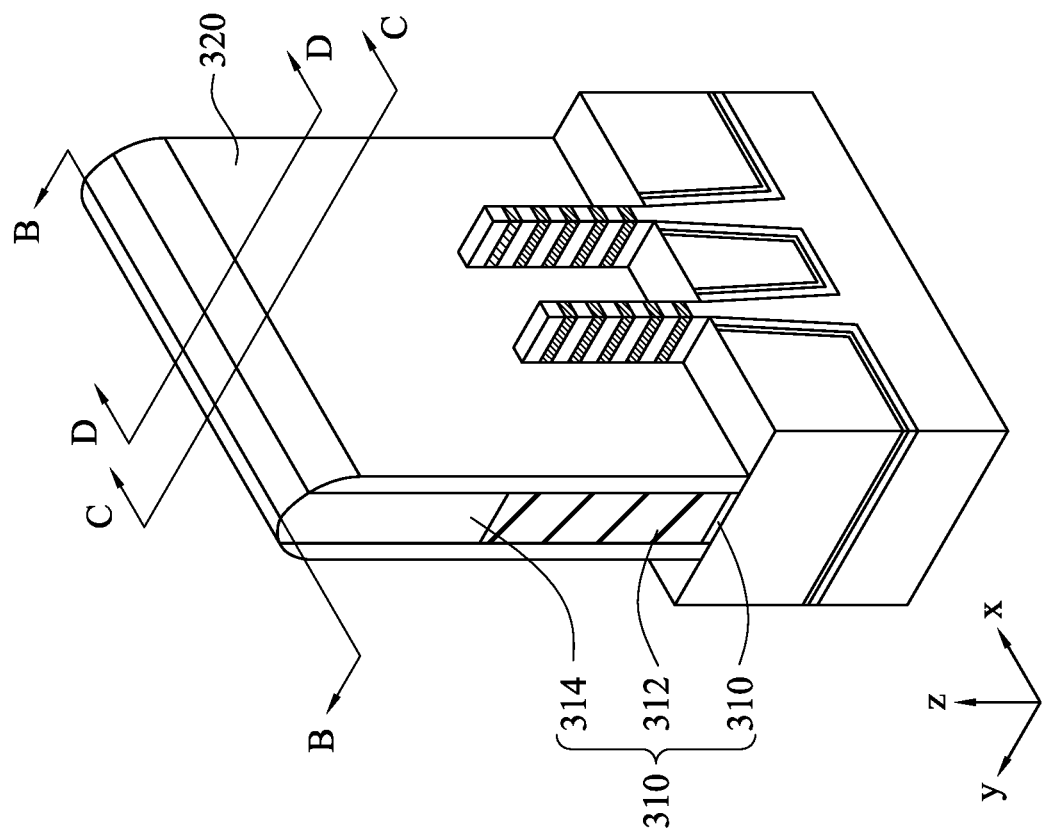
Figure 3D:
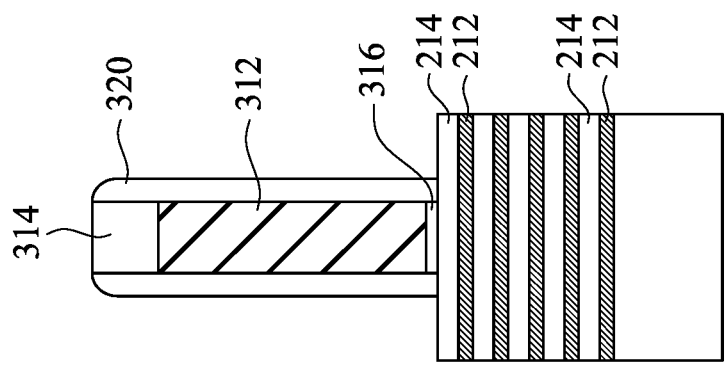
Figure 3D:
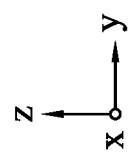
Figure 3C:
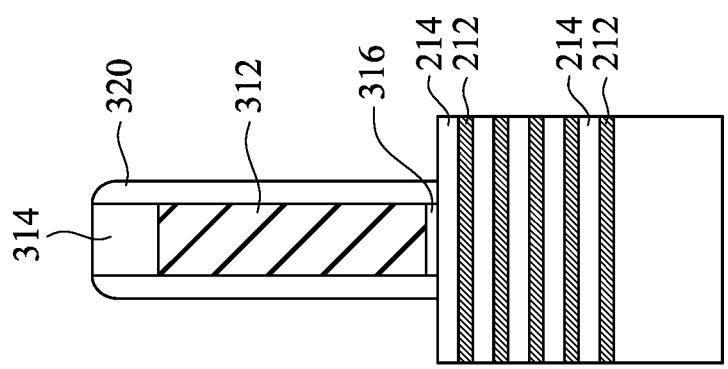
Figure 3C:
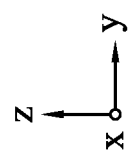

Referring to FIG. 13, in example operation 1310, a wafer 100 is received. FIGS. 1A-1D illustrate the wafer 100. FIG. 1A is a perspective view, FIG. 1B is a sectional view from cutting line B-B of FIG. 1A, FIG. 1C is a sectional view from cutting line C-C of FIG. 1A, and FIG. 1D is a sectional view from cutting line D-D of FIG. 1A. The figures described herein include stages of the wafer 100 in the example fabrication process 1300 as shown in FIG. 13. At each stage, one or more of the four views of the wafer 100 are shown, i.e., the perspective view referenced with letter "A", a sectional view from cutting line B-B, referenced with letter "B" and also referred to as "B" plane (X-Z plane), a sectional view from cutting line C-C, referenced with letter "C" and also referred to as "C" plane, and a sectional view from cutting line D-D, referenced with letter "D" and also referred to as "D" plane. In some of the perspective view figures that follow FIG. 1A, the cutting lines B-B, C-C, and D-D are omitted for simplicity purposes.

Referring to FIGS. 1A-1D together, the wafer 100 includes a substrate 110, e.g., of silicon, silicon germanium, and/or other suitable semiconductor materials. For example, the substrate 110 may include a compound semiconductor such as silicon carbide, gallium arsenide, indium arsenide, and/or indium phosphide. Further, the substrate no may also include a silicon-on-insulator (SOI) structure.

A vertical stack of epitaxy layers 112, 114 of different materials are formed over the substrate no and are stacked in an alternating manner, i.e., each epitaxy layers 112, 114 is immediately and vertically adjacent to a different one of the epitaxy layers 112, 114. FIGS. 1A-1D show, as an illustrative example, that totally five epitaxy layers 112 and five epitaxy layers 114 are stacked over the substrate no, which is not limiting. Other numbers of the epitaxy layers 112, 114 are also possible and included in the disclosure. In an embodiment, the wafer 100 includes a same number of the epitaxy layers 112 as the epitaxy layers 114, which is also not limiting.

The epitaxy layers 112 are formed of a first semiconductor material and the epitaxy layers 114 are formed of a second semiconductor material different from the first semiconductor material. In an embodiment, the first semiconductor material and the second semiconductor materials have different etching rates with some etchants such that a selective etching may be conducted to remove one of the epitaxy layers 112, 114 with the other one remaining. In an embodiment, the epitaxy layer 112 is silicon germanium of $Si_xGe_{1-x}$ being greater than 0 and smaller than 1, and in some embodiments between 0.4 and 0.9. In an embodiment, the epitaxy layer 114 is silicon.

The epitaxy layers 112, 114 may be doped in various approaches with various dopants/impurities, like arsenic, phosphorous, boron, gallium, indium, antimony, oxygen, nitrogen, or various combinations thereof.

In an embodiment, the epitaxy layers 112, 114 each are sheets of one-dimensional (1-D) nanowire silicon germanium or 1-D nanowire silicon, respectively, and are referred to here as nanosheets. Each of the epitaxy layers 112, 114 may include a thickness between about 5 nm to about 40 nm. In another embodiment, epitaxy layers 112, 114 may also be nanosheets of two-dimensional silicon germanium or silicon, respectively. The epitaxy layers 112, 114 may also be other semiconductor materials.

Epitaxy layers 112, 114 may be formed using any suitable epitaxy processes and/or nanosheet formation techniques and all are included in this disclosure. For example, the vapor-liquid-solid (VLS) technique may be used to grow nanosheets 112, 114 over the silicon substrate no. In the description herein, nanosheets 114, 112 of 1-D nanowire silicon or silicon germanium, respectively, are used as illustrative examples in the description of the disclosure.

Referring back to FIG. 13, with respect also to FIGS. 2A-2D, in example operation 1320, two fin structures 202 (202A, 202B) are formed by patterning the wafer 100. Any suitable patterning processes may be used and all are included in the disclosure. The fin structures 202 (202A, 202B) each includes two portions, an upper portion 204 (204A, 204B, respectively), and a lower portion 206 (206A, 206B, respectively). The lower portions 206A, 206B are formed from patterning the substrate no, e.g., of silicon, and are also part of the substrate no and are referred to as "substrate." The upper portions 204 (204A, 204B) are formed from patterning the stacked epitaxy layers 112, 114. In the example case that the epitaxy layers 112, 114 are nanosheets, the upper fin portions 204 (204A, 204B) include 1-D nanowires silicon germanium strips 212, and 1-D nanowire silicon strips 214 vertically stacked in an alternating manner, see FIGS. 2C and 2D. The stacks of the 1-D nanowire strips 212, 214 are referred to as nanowire stacks 210 (210A, 210B).

In the following fabrication stages, either the nanowire strips 212 or the nanowire strips 214 may be removed from one of the nanowire stacks 210A, 210B and are referred to as the 'sacrificial strips". The nanowire strips 214, 214 that remain on a nanowire stack 210 are referred to as the 'semiconductor nanowire strips." As illustrative examples, the silicon germanium nanowire strips 212 are removed as sacrificial strips in the nanowire stack 210A and the silicon nanowire strips 214 are removed as sacrificial strips in the nanowire stack 210B. As such, the silicon nanowire strips 214 are the semiconductor nanowire strips for the nanowire stack 210A and the silicon germanium nanowire strips 212 are the semiconductor nanowire strips for the nanowire stack 210B.

An insulation layer 220 is formed over the substrate no and adjacent to the fin structures 202. In an embodiment, the insulation layer 220 is silicon oxide or other suitable dielectric material. Optionally, an etch stop layer 230 is formed between the insulation layer 220 and the substrate no including the lower portion 206 of the fin structure 202. The etch stop layer 230 is a different dielectric material from the insulation layer 220. In an embodiment, the etch stop layer 230 is silicon nitride or other suitable dielectric materials. In an embodiment, the insulation layer 220 and the etch stop layer 230 are adjacent only to the lower fin portion 206, and the upper fin portion 204 is exposed from the insulation layer 220 and the etch stop layer 230. That is, the upper surfaces 222, 232 of the insulation 220 and the etch stop layer 230, respectively, are lower than the upper fin portion 204.

Referring back to FIG. 13, with reference also to FIGS. 3A-3D, in example operation 1330, a sacrificial gate structure 310 (also called "dummy gate") is formed over the insulation layer 220 and the fin structures 202. In an embodiment, the sacrificial gate structure 310 may include a sacrificial polysilicon layer 312, a sacrificial cap layer 314, and a sacrificial dielectric layer 316. The sacrificial cap layer 314 and the sacrificial liner layer 316 may be silicon oxide or other suitable dielectric materials. The total height of the sacrificial gate structure 310 may be higher or substantially equal to, but not lower than, the replacement gate that is to be made in the space occupied by the sacrificial gate structure 310.

A spacer 320 is formed adjacent to the sacrificial gate structure 310. The spacer 320 may be silicon nitride or other suitable dielectric materials. The 1-D nanowire strips 212, 214 each laterally extend beyond the spacer 320 in the Y-axis direction. The spacer 320 may also be called an "outer spacer" to differentiate from an "inner spacer" described herein.

In the following FIGS. 4B to 11B, the view of the sacrificial gate structure 310 including the sacrificial polysilicon layer 312, the sacrificial cap layer 314, and the sacrificial liner layer 316 are omitted from the B plan cross-sectional views for simplicity.

In example operation 1340, with reference also to FIGS. 4A-4D, some (not all) of the semiconductor nanowire strips 212, 214 are receded to form receded nanowire strips 212RC, 214RC. In an embodiment, the semiconductor nanowire strips 212, 214 stacked on the top of the nanowire stacks 210 are receded. FIGS. 4A-4D show that the topmost nanowire strip 212 and the topmost nanowire strip 214 are receded, as an illustrative example, which is not limiting. More than one nanowire strips 212, including the topmost nanowire strip 212, and more than one nanowire strips 214, including the topmost nanowire strip 214, could be receded in accordance with embodiments of the present disclosure. In an embodiment, the receding may be achieved by anisotropic dry etching, e.g., RIE or plasma based dry etching, or other suitable etching approached. In another embodiment, the receding may be achieved by anisotropic wet etching in the scenarios that the crystalline orientations of the nanowire strips 212, 214 are suitable for the relevant wet etchants, e.g., THAH (tetra methyl ammonium hydroxide).

FIGS. 4A-4D show that on the nanowire stack 210A and the nanowire stack 210B, both the topmost nanowire strip 212 of silicon germanium and the topmost nanowire strip 214 of silicon are receded, i.e., both the semiconductor nanowire strip and the sacrificial strip are receded, which is not limiting. It is possible, in accordance with disclosed embodiments, through selective etching that only the top semiconductor nanowire strips, i.e., the strip 212 for the nanowire stack 210A and the strip 214 for the nanowire stack 210B, are receded and the sacrificial strips, the strips 212 for the nanowire stack 210A and the strips 214 for the nanowire stack 210B, are not receded in this operation. For example, for the nanowire stack 210A, only the top (including the topmost) semiconductor nanowire strips 214 of 1-D nanowire silicon is receded, and for the nanowire stack 210B, only the top (including the topmost) semiconductor nanowire strip 214 of silicon germanium is receded. In an embodiment, the top sacrificial strips, e.g., the top strips 212 for the nanowire stack 210A and the top strips 214 for the nanowire stack 210B, are not receded in example operation 1340 and are receded together with all other sacrificial strips 212, 214 in the example operation 1350 described herein. For example, the example operation 1340 may be conducted after the example operation 1350 and the top semiconductor nanowire strips may be receded in the example operation 1340 after all the sacrificial nanowire strips are receded together in the example operation 1350.

Further, in the case that both the top silicon nanowire strip 214 and the top silicon germanium nanowire strip 212 are receded, they may be receded through a same receding process, e.g., of non-selective anisotropic dry etching, or through two separate receding processes using, e.g., different dry etching procedures.

In an embodiment, the top nanowire strips 212, 214 are receded such that their respective edges 416, 418 each substantially overlap with the outer sidewall 410 of the spacer 320. In other embodiments, the receded nanowire strips 212RC and 214RC may extend beyond the outer sidewall 410 of the spacer 320. The receded nanowire strips 212RC and 214RC may also be receded such that the respective edges 416, 418 each extends undercut below the spacer 320, as illustrated by the dotted lines 414', 418' in FIGS. 4C and 4D. In an embodiment, the edges 416, 418 do not extend inward beyond the inner sidewall 420 of the spacer 320. As discussed herein, for the nanowire stack 210A, the silicon germanium nanowire strips 212 will be used as sacrificial strips, and for the nanowire stack 210B, the silicon nanowire strips 214 will be used as sacrificial strips. The sacrificial strips may be receded to extend inward beyond the inner sidewall 420 of the spacer 320. In an embodiment, the edges 416, 418 are substantially plumb to facilitate a heterojunction contact interface with another semiconductor layer, e.g., a source/drain structure. However, the edges 416, 418 may include other shapes, e.g., concave or convex shapes, which are all included in the disclosure.

Figure 4A:
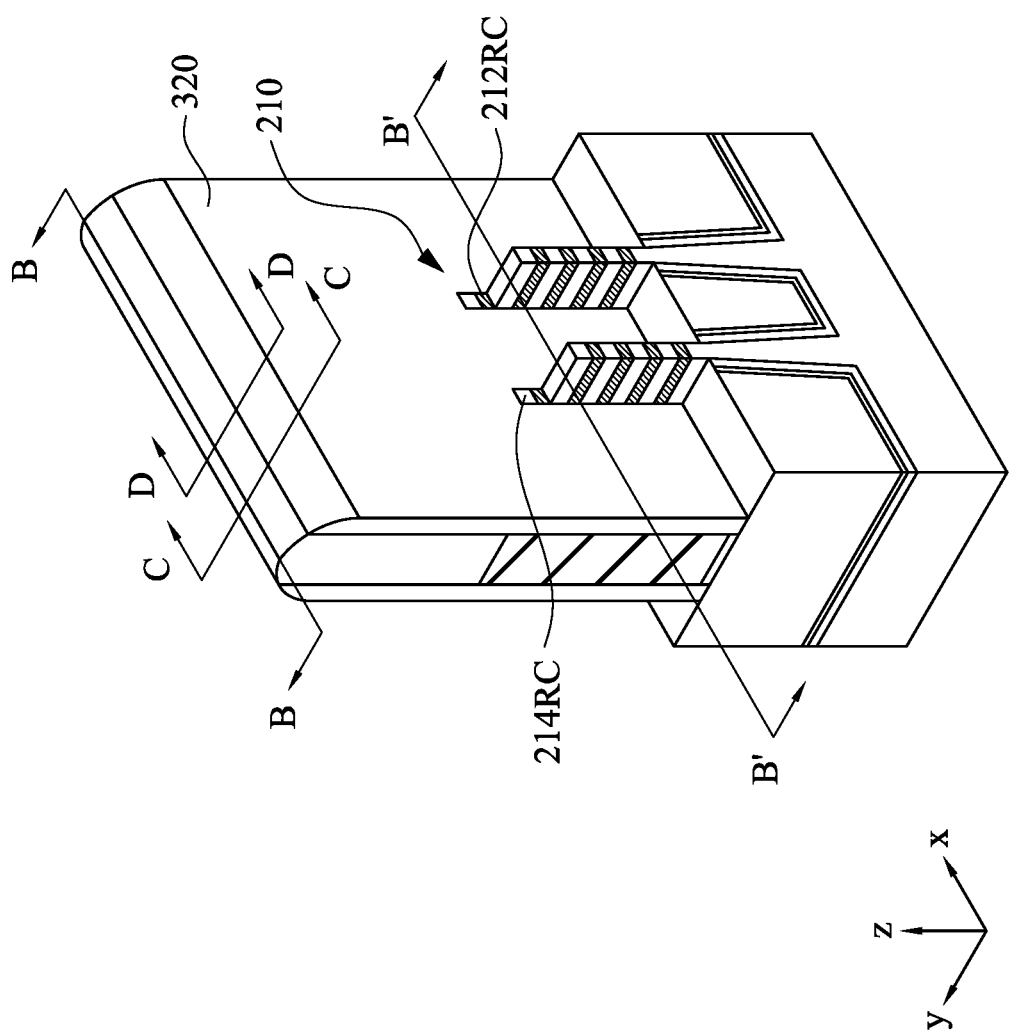
Figure 4B:
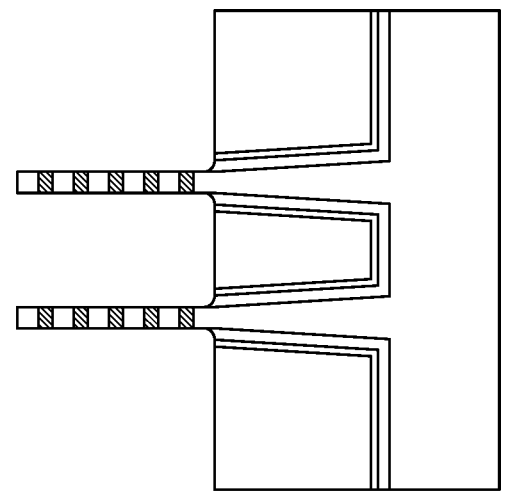
Figure 4B:
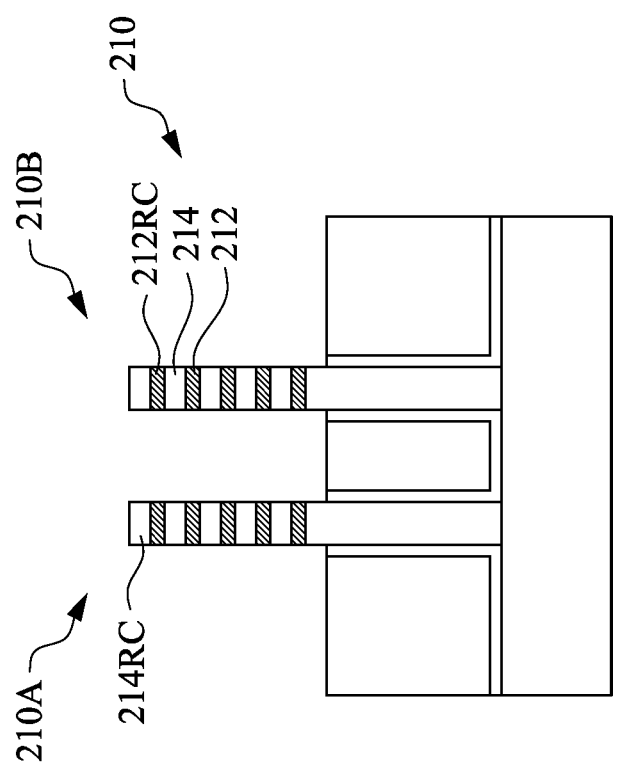

FIGS. 4B and 4B' shows the B plane from different cut lines B-B versus B'-B'. The receded nanowire strips 212RC and 214RC, which do not protrude out from the spacer 320 as far as the rest of the nanowire strips 212, 214, are shown in FIG. 4B and are not shown in FIG. 4B'.

Figure 5B:
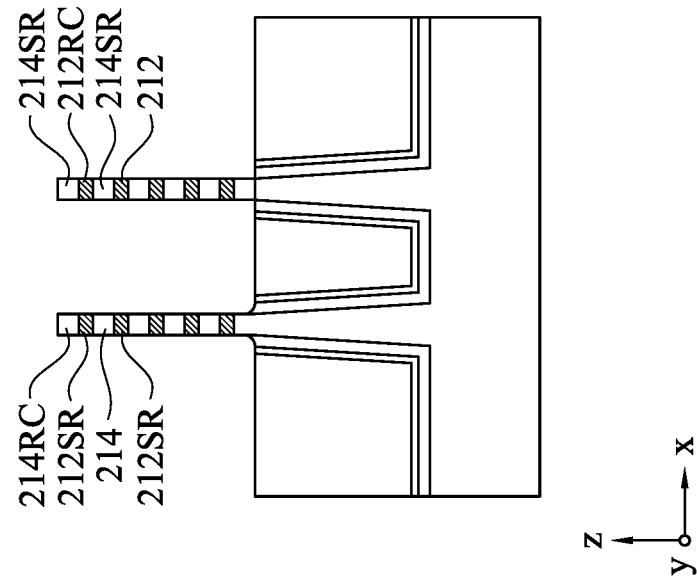
Figure 5A:
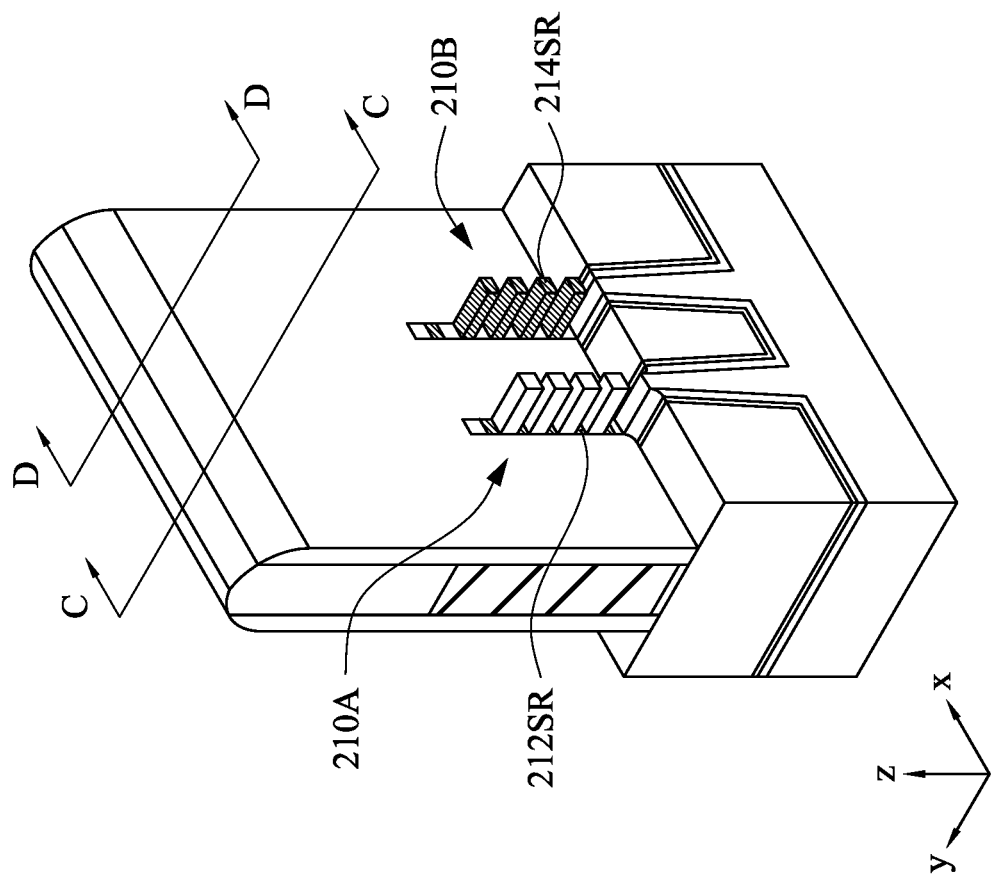
Figure 5D:
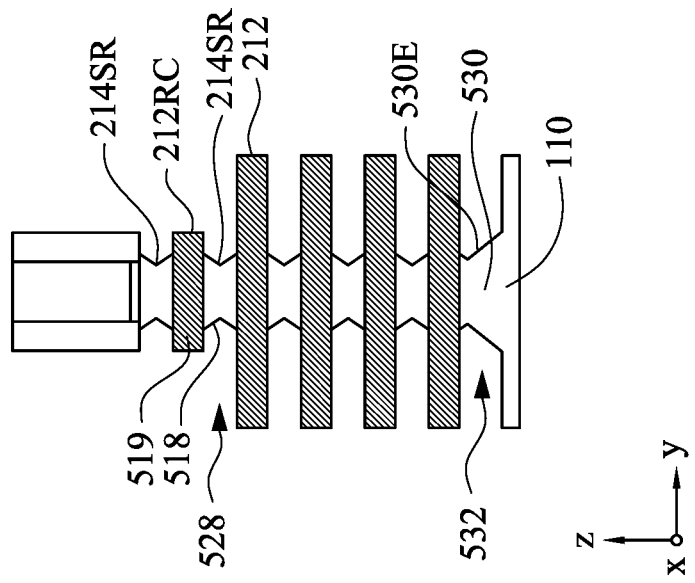
Figure 5C:
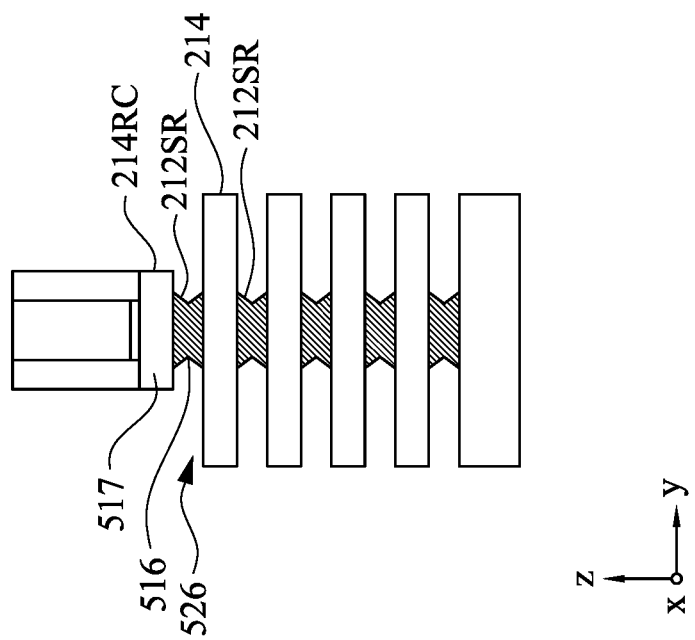

In example operation 1350, with reference also to FIGS. 5A-5D, sacrificial ones of the nanowire strips 212, 214 are receded to formed receded sacrificial nanowire strips. In an embodiment, all the sacrificial strips 212 or 214 in a same nanowire stack 210 (210A, 210B) are receded uniformly. For the nanowire stack 210A, the silicon germanium nanowire strips 212 are used as the sacrificial strips and are receded to form receded sacrificial strips 212SR. For the nanowire stack 210B, the silicon nanowire strips 214 are used as the sacrificial strips and are receded to form receded sacrificial strips 214SR. Note that the previously receded nanowire strips 212RC, 214RC may be further receded to be uniform with the rest of the sacrificial strips 212, 214 in the same nanowire stack 210A, 210B, respectively, if used as the sacrificial strips. For example, as shown in FIGS. 5C and 5D, the sacrificial strips 212SR, 214SR are receded inward further than the receded semiconductor strip 214RC, 212RC, respectively. As such, edge portions 517, 519 of the receded semiconductor nanowire strips 214RC, 212RC includes more surface areas to interface with/contact another semiconductor structure than the respective edge surfaces 418, 416. In a case that the top sacrificial strips 212, 214 are receded together with the top semiconductor nanowire strips 214RC, 212RC in the example operation 1340, the receded top sacrificial strips 212RC, 214RC are receded further to become 212SR, 214SR in the example operation 1350.

In an embodiment, as best seen in FIGS. 5C and 5D, the receded sacrificial strips 214SR, 212SR are each shorter along the Y-axis than the respective receded semiconductor nanowire strip 212RC, 214RC in the respective nanowire stack 210B, 210A, respectively. In other words, as best seen in FIGS. 5C and 5D, the lengths of the receded sacrificial strips 214SR, 212SR along the Y-axis are each less than the lengths along the Y-axis of the respective receded semiconductor nanowire strip 212RC, 214RC in the respective nanowire stack 210B, 210A, respectively. As shown in FIGS. 5C, 5D, a receded sacrificial strip 214SR, 212SR extends undercut below the respective receded semiconductor nanowire strip 212RC, 214RC.

The receding of the sacrificial strips 212, 214 may be implemented through etching. The etchants are selected to have sufficient selectivity between silicon and silicon germanium such the sacrificial strips 212 (or 214) are receded and the semiconductor nanowire strips 214/214RC (or 212/212RC) remain.

In an embodiment, the etching conditions are controlled such that the resulted edge surfaces 516, 518 of the receded sacrificial strips 212SR, 214SR, respectively, each is recessed, i.e., including an indentation 526, 528. For example, suitable wet etching is used in the receding of the sacrificial strips 212 or 214 to form the indentation 526, 528 on the resulted edge surfaces 516, 518, respectively. In other embodiments, reactive ion etching (RIE) may be used to form the indentations 526, 528.

In an embodiment, the substrate no, or more specifically the lower portion 206 of the fin structure 202, may also be partially receded to form a receded portion 530 such that the bottommost semiconductor nanowire strip 212, 214 is separated from the substrate no by a gap 532 except the receded portion 530. In an embodiment, an edge portion 530E of the receded portion 530 of the substrate no includes a different shape from the edge surface 518 of the receded sacrificial strips 214SR because the receding of the substrate no is restricted differently by the semiconductor nanowire strips 212 than the receding of the sacrificial strips 214. In the case that the bottommost semiconductor strip 212, 214 is already separated from the substrate no by a receded sacrificial strip 214, 212, like the example illustrated in FIG. 5C, the substrate no is not receded.

In example operation 1360, with reference also to FIGS. 6A-6D, inner spacers 610A, 610B are formed adjacent to the edge surfaces 516, 518 of the receded sacrificial strips 212SR, 214SR, respectively. In an embodiment, the inner spacers 610A, 610B follow the profiles of the respective edge surfaces 516, 518 of the receded sacrificial strips 212SR, 214SR, and each also includes an indentation 620A, 620B, respectively. The inner spacers 610A, 610B are silicon nitride or other suitable dielectric materials.

In an embodiment, a first inner spacer segment 610A(1), 610B(1) adjacent to the respective receded semiconductor nanowire strip 214RC, 212RC, respectively, has substantially a uniform or same profile as a second inner spacer segment 610A(2), 610B(2) that are adjacent to a semiconductor nanowire strip 214, 212, respectively.

Figure 6B:
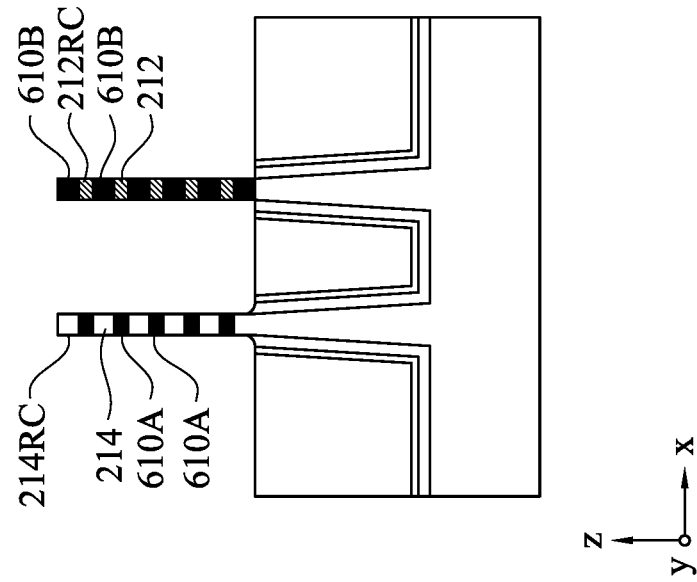
Figure 6A:
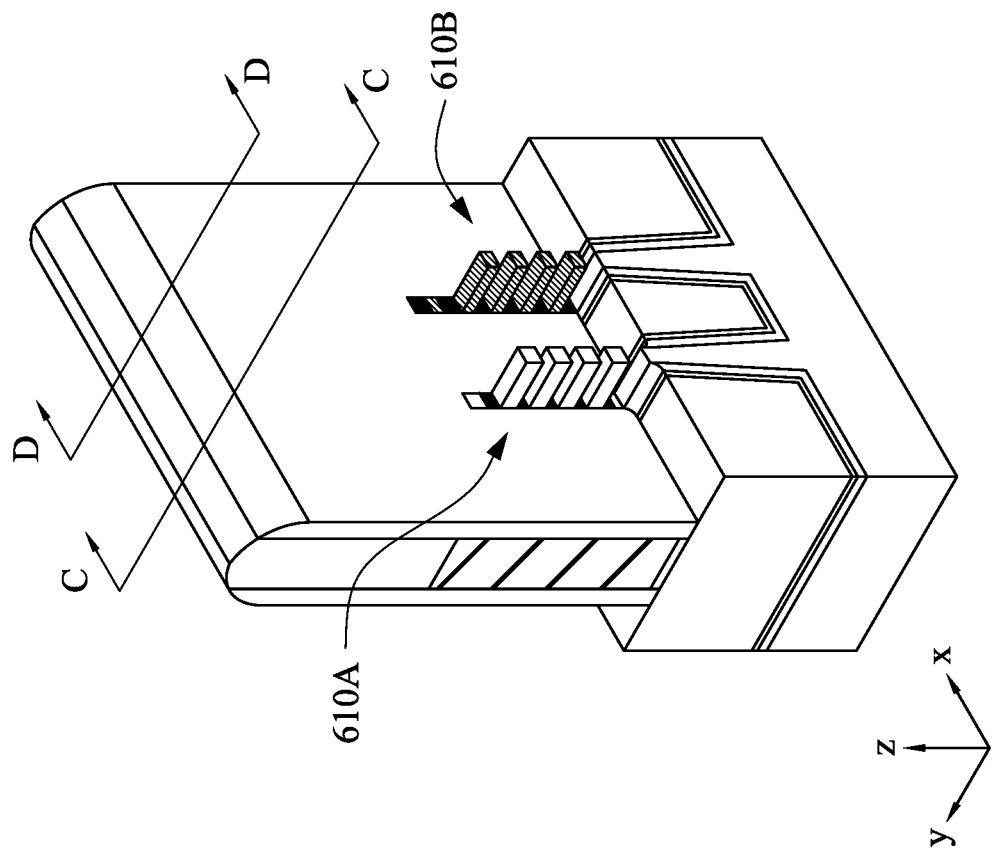
Figure 6D:
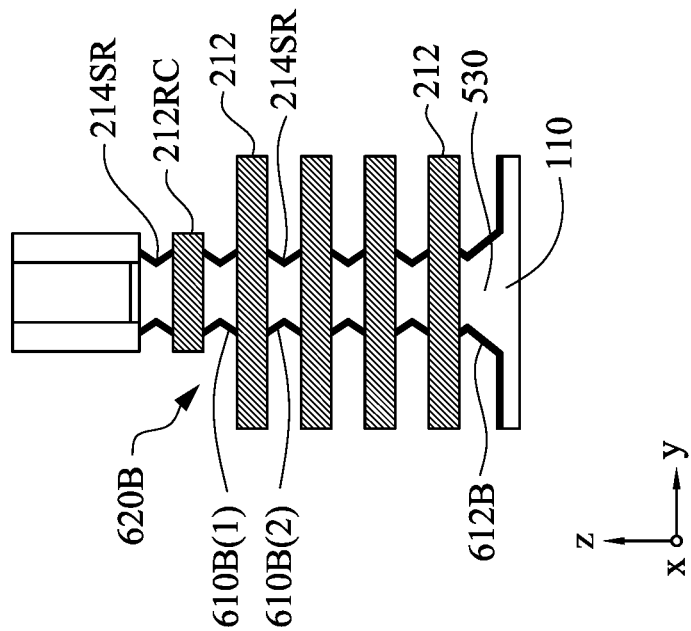
Figure 6C:
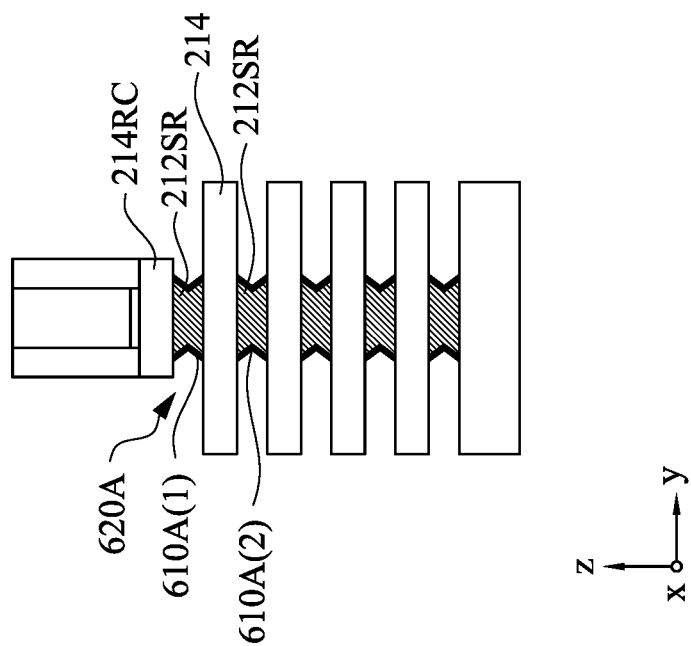
Figure 7B:
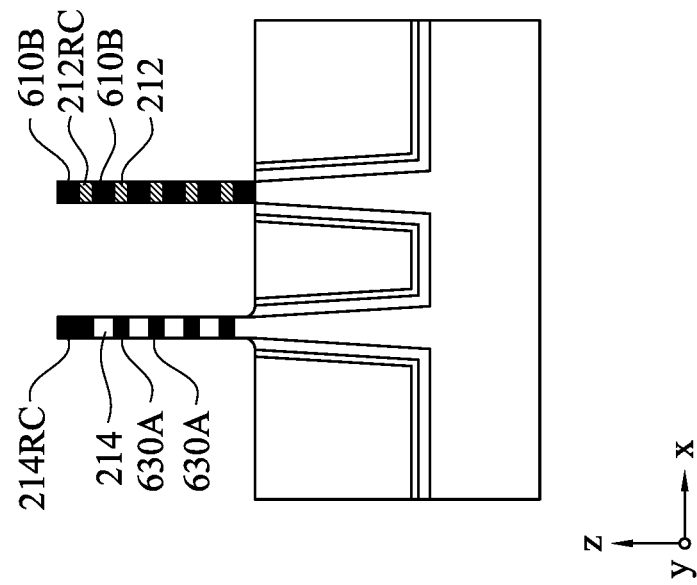
Figure 7A:
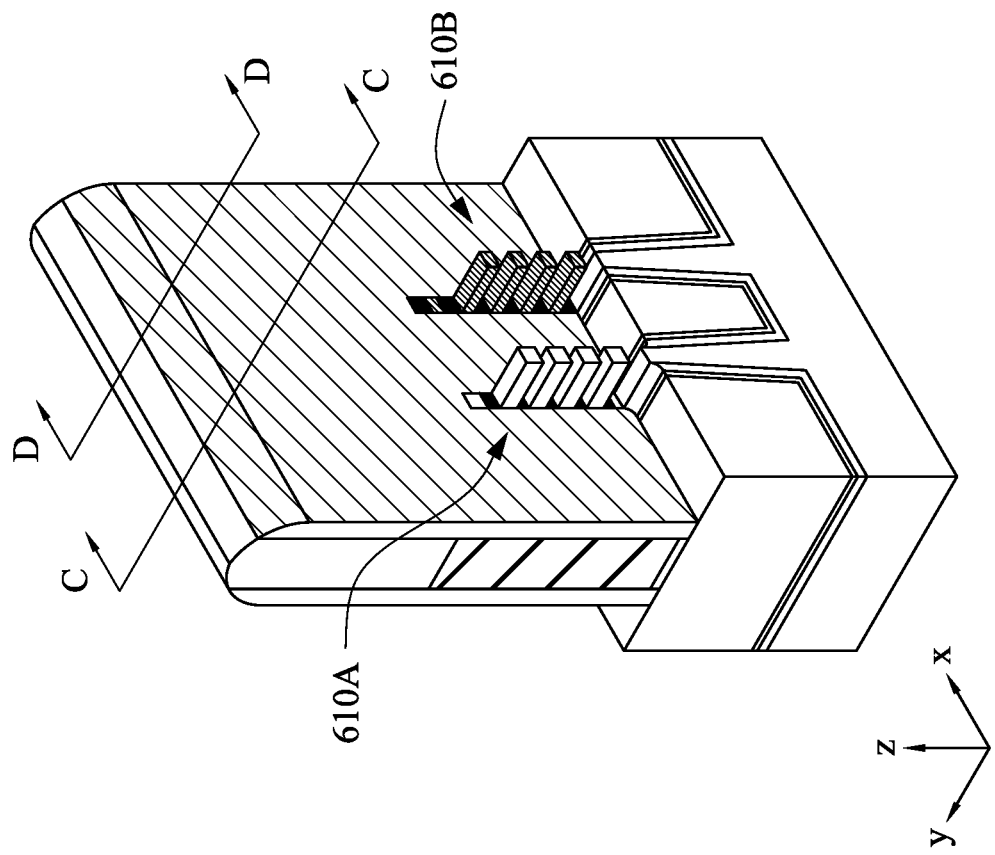
Figure 7D:
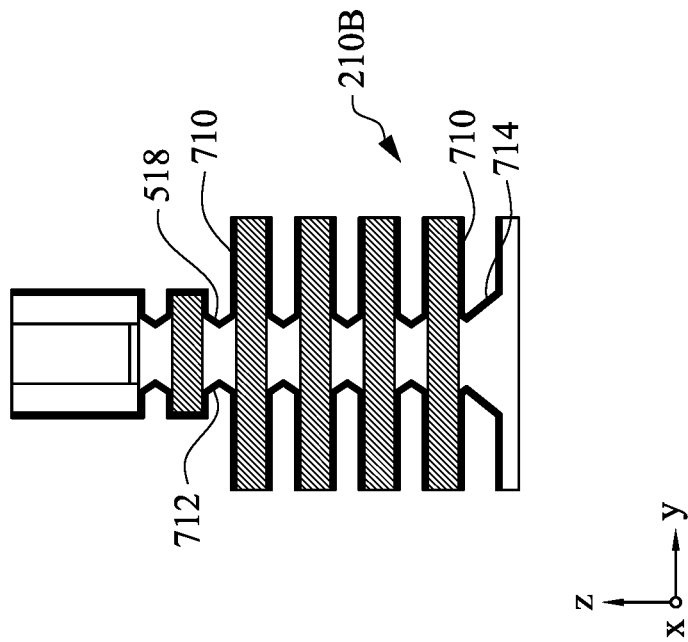
Figure 7C:
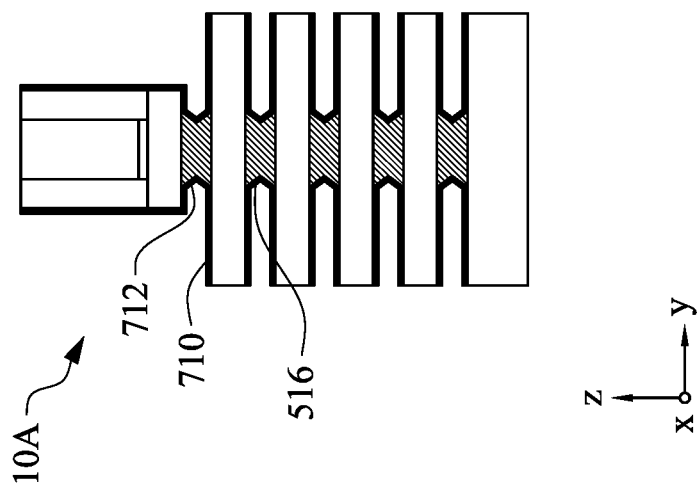

As shown in FIG. 6D, in an embodiment where the bottommost semiconductor strip, here the bottommost nanowire silicon germanium strip 212, is of a different semiconductor material from the substrate no, here, e.g., of silicon an inner spacer segment 612B is formed adjacent to the receded portion 530 of the substrate no. In an embodiment, the inner spacer segment 612B includes a different shape/profile from that of the inner spacer segment 610B because the edge surface 530E (FIG. 5D) of the receded portion 530 is different from the edge surface 518 of the receded sacrificial strips 214SR. In an embodiment, the inner spacer segment 612B is a same dielectric material as the inner spacer 610B and is formed in a same deposition process as the inner spacers 610A, 610B.

In an embodiment, depending on the etching process of receding the sacrificial strips 212SR, 214SR, the inner spacers 610A, 610B may also wrap around the relevant semiconductor nanowire strips 214, 214RC, 212, 212RC. For example, the receding of the sacrificial strips 212SR, 214SR may also remove some portions of the semiconductor nanowire strips 214/214RC, 212/212RC such that gaps are formed between the outer spacer 320 and the semiconductor nanowire strips 214/214RC, 212/212RC. In this scenario, the inner spacers 610A, 610B are formed wrapping around the respective semiconductor nanowire strips 214/214RC, 212/212RC.

FIGS. 7 (A, B, C, D) to 10 (A, B, C, D) show an example process of forming the inner spacers 610A, 610B. Referring to FIGS. 7C and 7D, a dielectric layer 710, e.g., of silicon nitride, is formed as an epitaxial layer adjacent to the edge surfaces 516, 518 of the receded sacrificial strips 212SR, 214SR of the nanowire stacks 210A, 210B. The dielectric layer 710 may be formed using chemical vapor deposition (CVD), plasma-enhanced CVD (PECVD), atomic layer deposition (ALD), molecule layer deposition (MLD) or other suitable processes. Besides being adjacent to the edge surfaces 516, 518 of the receded sacrificial strips 212SR, 214SR, the dielectric layer 710 may also be formed over the semiconductor nanowire strips 212, 212RC, 214, 214RC, depending on the process flow.

In an embodiment, with proper control of the growth process, e.g., ALD or MLD, portions 712 of the dielectric layer 710, which is adjacent to the edge surfaces 516, 518 of receded sacrificial strips 212SR, 214SR follow the profiles of the edge surfaces 516, 518 and include an indentation toward the respective receded sacrificial strips 212SR, 214SR.

In an embodiment, the dielectric layer 710 is also formed adjacent to the receded substrate portion 530, and is referred to as portion 714 of the dielectric layer 710.

Figure 8B:
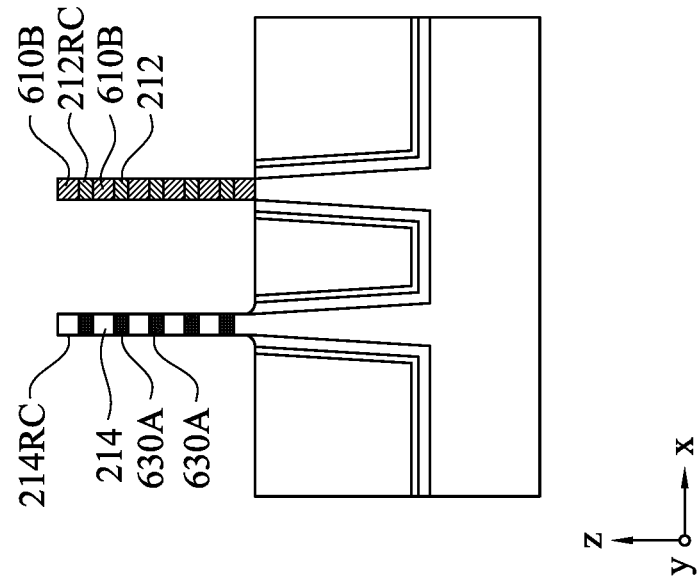

Referring to FIGS. 8C and 8D, an etch stop layer 810 is formed only adjacent to the portions 712 of the dielectric layer 710. The etch stop layer 810 include a dielectric material having etching selectivity over the dielectric layer 710. In an embodiment, the etch stop layer 810 is formed through ALD or CVD. The etching element of the ALD or CVD procedure may be controlled such that material of the etch strop layer 810 stops formation at an edge of the aspect ratio change. As such, the etch stop layer 810 is formed within the spatial restriction set by the semiconductor nanowire strips 214/214RC, 212/212RC, the outer spacer 320 and/or the substrate no. More specifically, because the edge surfaces 516, 518 of the sacrificial strips 212SR, 214SR recede inward further than the receded semiconductor nanowire strips 214RC, 212RC, respectively, the etch strop layer 810 is formed adjacent to the sacrificial strips 212SR, 214SR adjacent to the receded semiconductor nanowire strips 214RC, 212RC and the etch stop layer 810 does not extend outward beyond the respective receded semiconductor nanowire strips 214RC, 212RC, which mark the aspect ratio change.

Figure 8A:
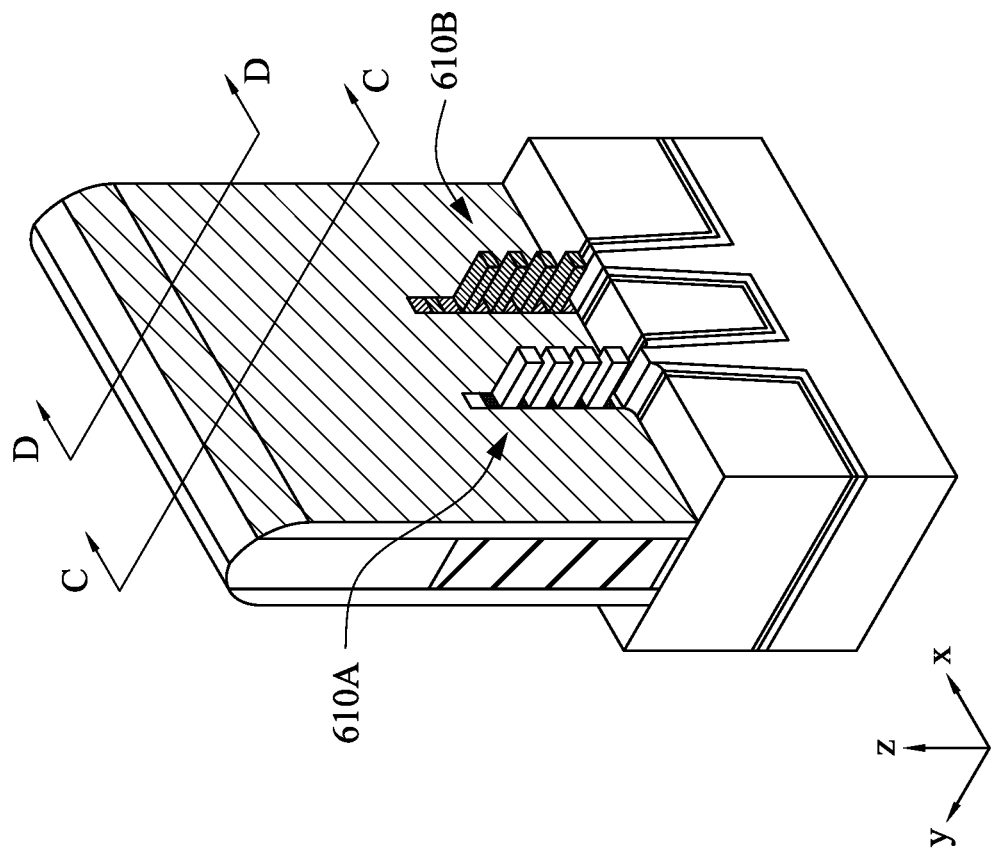

FIG. 8' shows an example etch stop layer 810. As shown in FIG. 8', the etch stop layer 810 includes shapes like a plug and includes a head portion 812 and a base portion 814. The head portion 812, shown as a convex portion in an embodiment, interfaces with the portion 712 of the dielectric layer 710, which is adjacent to the receded sacrificial nanowire strips 212SR, 214SR. Specifically in an embodiment, the convex portion 812 fits into the recess of the portions 712. The base portion 814 extends outward from the portion 712 of the dielectric layer 710 and functions to further ensure that the portion 712 is not etched out and the sacrificial nanowire strips 212SR, 214SR are not exposed after the dielectric layer 710 is partially etched out as described herein.

In an embodiment, a base surface 816 of the etch stop layer 810 does not extend outward beyond the edge surface 418, 416 of the receded topmost semiconductor nanowire strips 214RC, 212RC. The base surface 816 is one of substantially plumb with the edge surface 418, 416 or positioned inward toward the sacrificial nanowire strips 212SR, 214SR. As such, when the dielectric layer 710 is partially etched out, and the etch stop layer 812 is removed, the edge portion 517, 519 or at least the edge surface 418, 416 of the receded topmost semiconductor nanowire strip 214RC, 212RC is exposed.

In an embodiment, a portion 812 of the etch stop layer 810 is formed adjacent to the receded portion 530 of the substrate no and covers the portion 714 of the dielectric layer 710. The portion 812 includes a different shape than the etch stop layer 810 formed adjacent to the receded sacrificial strips 212SR because the edge surface 530E of the receded portion 530 is different from the edge surface 518 of the receded sacrificial strip 212SR. In other words, the portion 712 of the dielectric layer 710 is different in shape from the portion 714 of the dielectric layer 710.

Figure 9B:
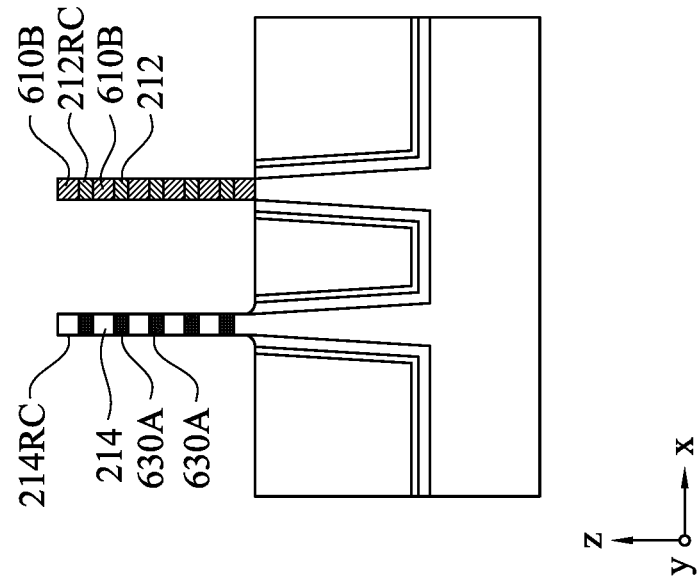
Figure 9A:
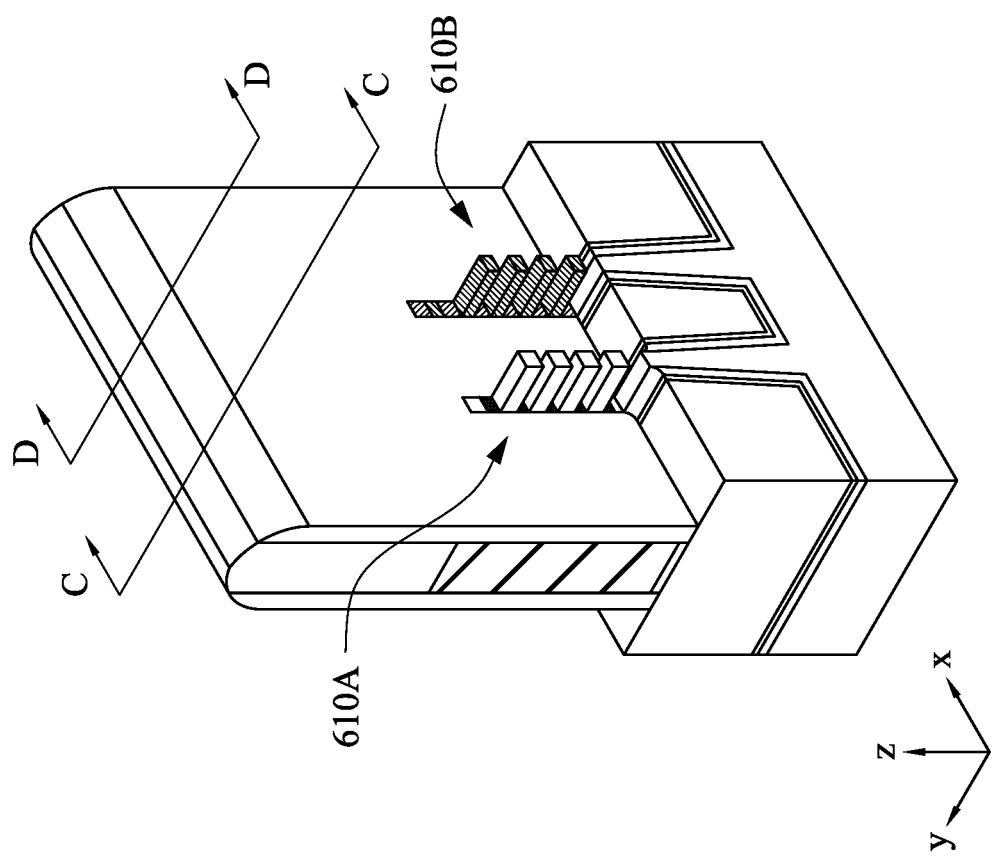
Figure 9D:
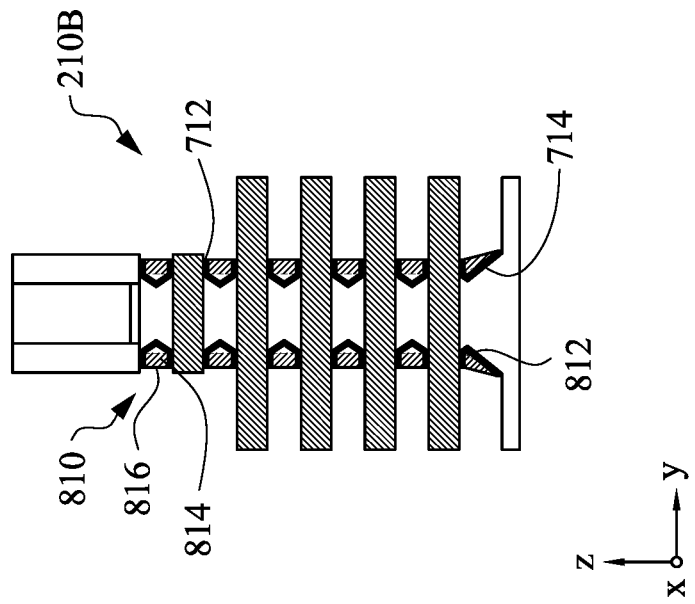
Figure 9C:
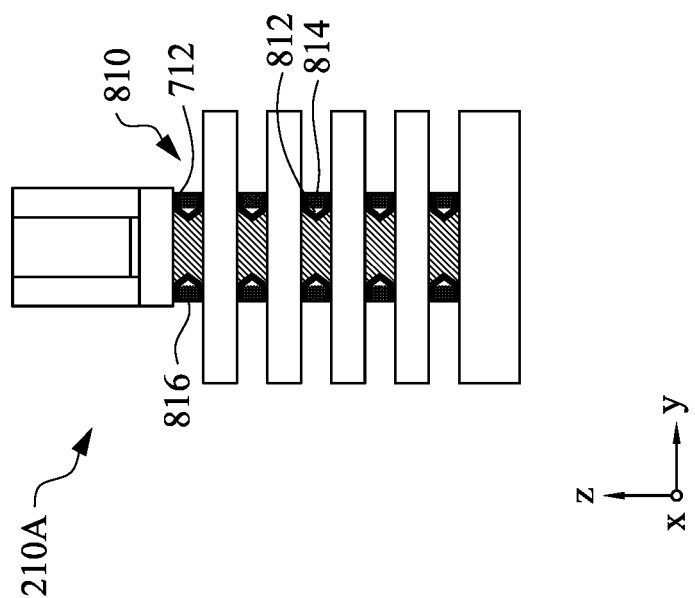

Referring to FIGS. 9C and 9D, using selective etching, portions of the dielectric layer 710 are removed except for the portions covered by the etch stop layer 810, i.e., the portions 712 adjacent to the edges 516, 518 of the receded sacrificial strips 212SR, 214SR and the portion 714 covered by the etch stop layer 812 adjacent to the receded portion 530 of the substrate no. In an embodiment, the portion 714 of the dielectric layer 710 that is formed adjacent to the receded substrate portion 530 is not removed and remains to become the dielectric layer 612B of FIG. 6D. For example, the dielectric layer 613 functions as an etch stop layer to prevent the portion 714 of the dielectric layer 710 from being etched out.

Figure 10B:
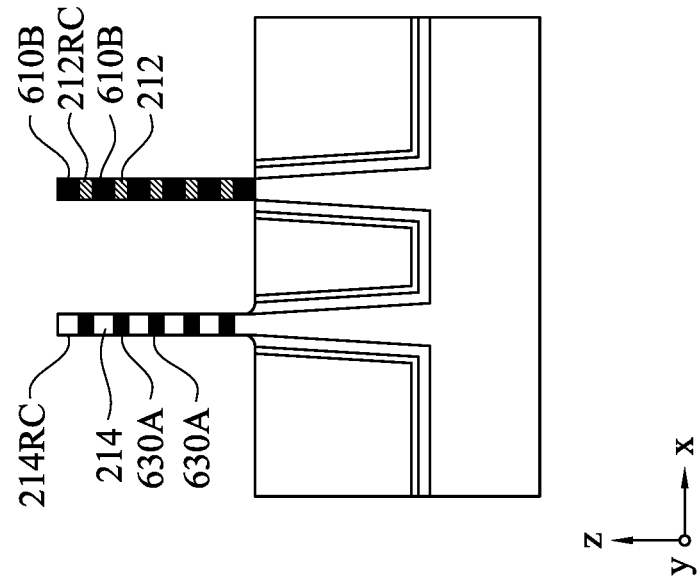
Figure 10A:
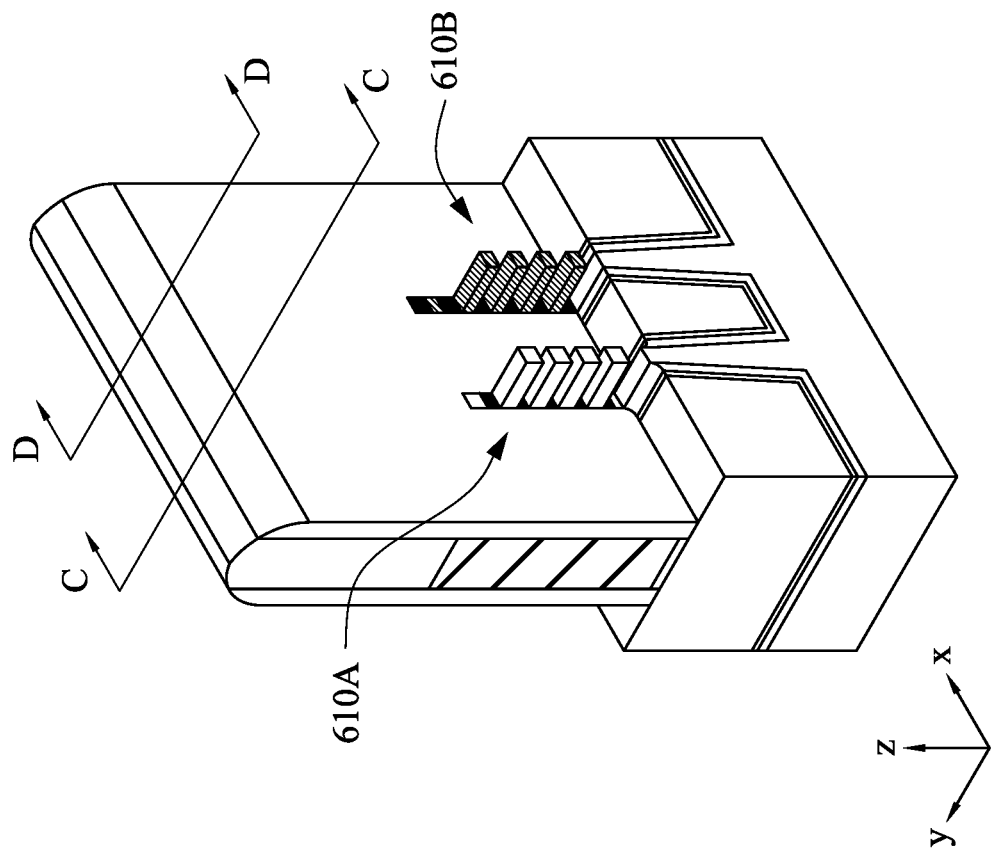
Figure 10D:
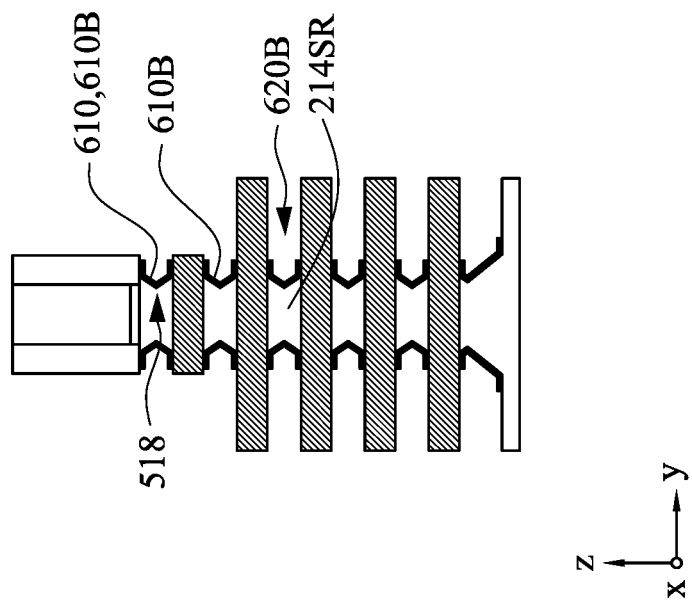
Figure 10C:
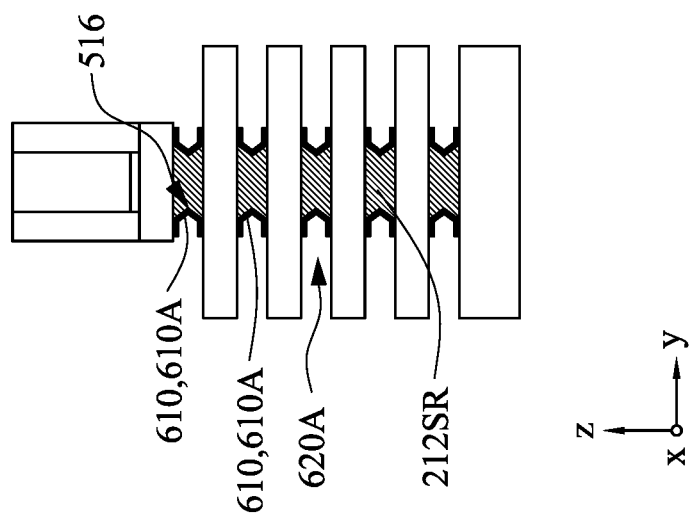

Referring to FIGS. 10C, 10D, the etch stop layer 810 (FIGS. 9C and 9D) is removed by selective etching. The resultant inner spacers 610 (610A, 610B) each follow the profiles of the edge surfaces 516, 518 of the receded sacrificial strips 212SR, 214SR, and each include the indentations 620A, 620B toward the respective receded sacrificial strips 212SR, 214SR. It should be appreciated that because the profiles of the edge surfaces 516, 518 may be different from one another due to the different crystalline structures and thickness of the 1-D nanowire strips 212, 214 of silicon germanium or silicon, respective, the inner spacers 610A, 610B may include different shapes and/or profiles from one another.

Because the etch stop layer 810 does not extend outward beyond the edge surfaces 418, 416 of the receded topmost semiconductor nanowire strip 214RC, 212RC, the inner spacers 610 (610A, 610B) each recedes inward with respect to the relevant topmost semiconductor nanowire strip 214RC, 212RC. In other words, the topmost semiconductor nanowire strip 214RC, 212RC each extends outward beyond the adjacent inner spacers 610A, 610B. This structural characteristic ensures that all the inner spacers 610A, 610B in a nanowire stack 210A, 210B include substantially the same shape or profile. More specifically, the inner spacer 610A, 610B adjacent to the topmost receded semiconductor nanowire strip 214RC, 212RC includes a substantially same shape or profile as the inner spacer 610A, 610B adjacent to a non-receded semiconductor nanowire strips 214, 212 in the same nanowire stack 210A, 210B.

Referring back to FIG. 13, with reference also to FIGS. 11A-11D, in example operation 1370, semiconductor layers 1110 (1110A, 1110B) are formed adjacent to the inner spacers 610A, 610B and the semiconductor nanowire strips 214, 214RC, 212, 212RC. In an embodiment, the semiconductor layers 1110A, 1110B each surrounds the semiconductor nanowire strips 214, 214RC, 212, 212RC that are exposed from the spacer 320 and the inner spacer 610 (610A, 610B). Specifically, the semiconductor layers 1110A, 1110B each is adjacent to the receded semiconductor nanowire strips 214RC, 212RC, respectively, and wraps around the semiconductor nanowire strips 214, 212, respectively.

Figure 11A:
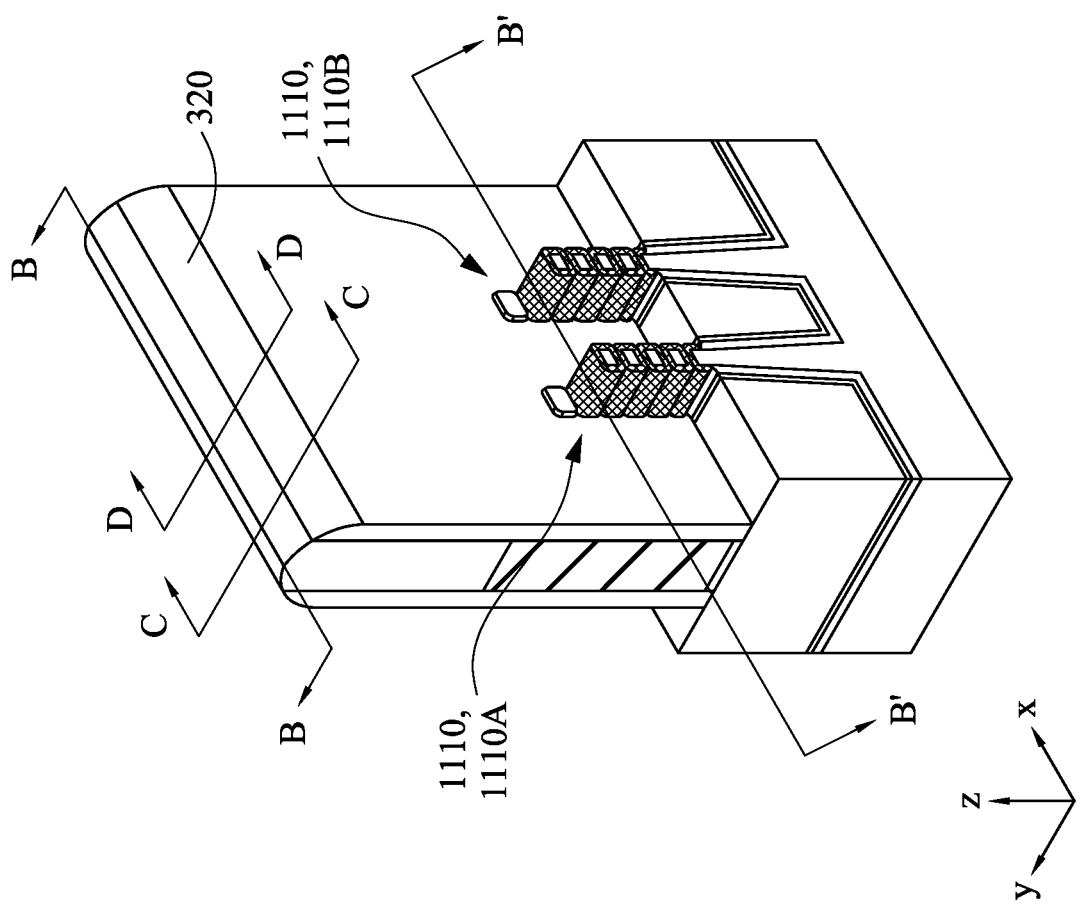
Figure 11B:
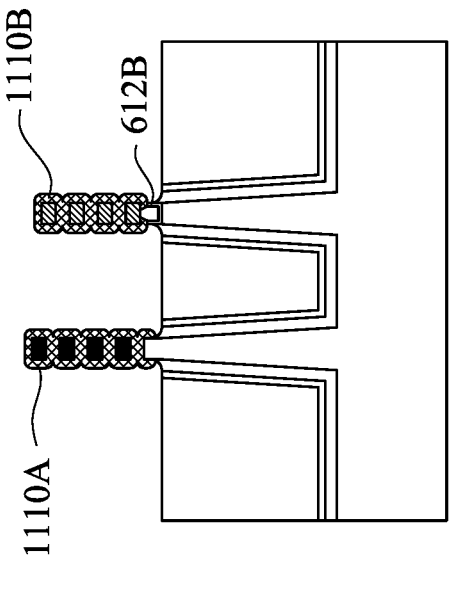
Figure 11B:
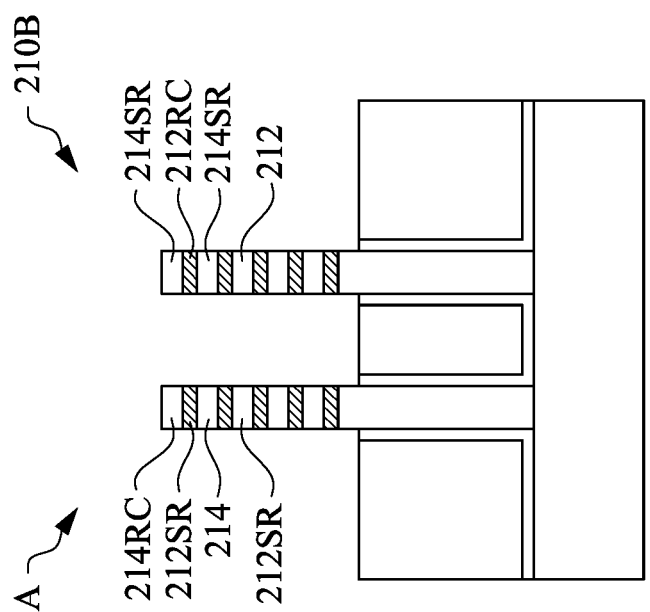
Figure 11D:
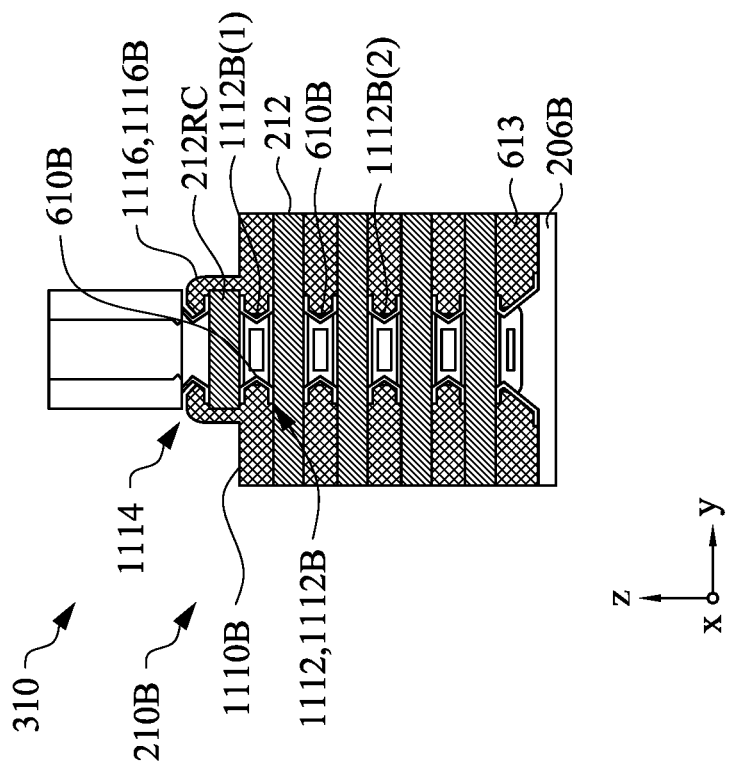
Figure 11C:
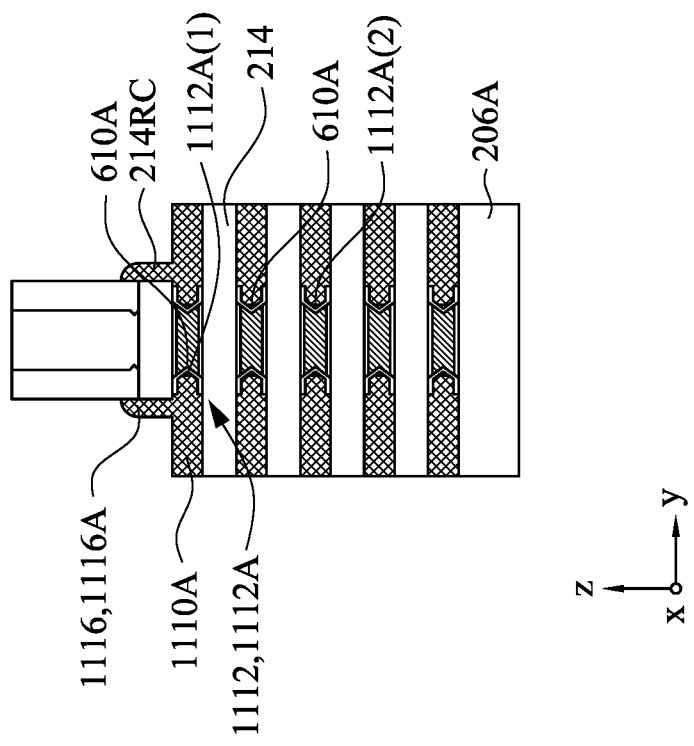

As shown in FIGS. 11C, 11D, cavities or voids 1112 (1112A, 1112B) are formed between the semiconductor layers 1110 (1110A, 1110B) and the respective inner spacers 610 (610A, 610B). The voids 1112 is formed based on at least one of the indentations 620A, 620B of the inner spacers 610A, 610B or the selective growth of the crystallography of the semiconductor layers 1110 (1110A, 1110B). More specifically, the facets of the epitaxy growth of the semiconductor layers 1110 form the voids 1112.

Figure 11:
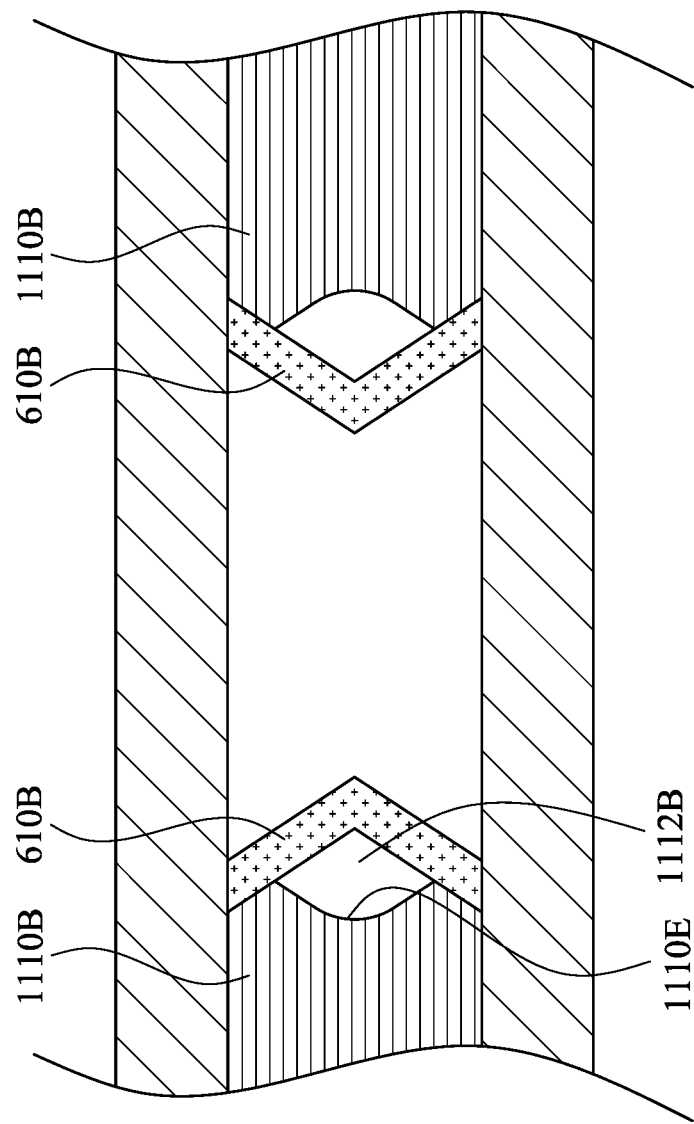

FIG. 11' shows an enlarged view of a void 1112B. As shown in FIG. 11', with selective growth of the crystallography of the semiconductor layer 1110B, the semiconductor layer 1110B includes a recessed portion adjacent to the respective inner spacer 610B. More specifically, an edge surface 1110E of the semiconductor layer 1110B includes an indented profile. The indented surface 1110E and the indentation 620B of the inner spacer 620B together form the void 1112B.

The similar descriptions also apply to the void 1112A of the nanowire stack 210A of FIG. 11C. In an embodiment, the recess portions/edge surfaces of the semiconductor layer 1112A are controlled to be consistent among the portions of the semiconductor layer 1110A adjacent to each inner spacer 610A. Further, in FIG. 11C, the inner spacer 610A are formed consistently adjacent to all the sacrificial strips 212SR. As such, the voids 1112A include a substantially same profile among all the semiconductor layers 1110A. More specifically, the voids 1112A adjacent to the receded topmost semiconductor nanowire strip 214RC include a substantially same shape or profile as a void 1112A adjacent to a non-receded semiconductor nanowire strip 214.

The semiconductor layers 1110 (1110A, 1110B) includes one or more of Ge, Si, GaAs, AlGaAs, SiGe, GaAsP, SiP, SiC, silicon-carbon-phosphide SiCP, silicon-germanium-boron SiGeB or other suitable semiconductor materials and may be doped in-situ during the epitaxy process by the supply of impurity sources or may be doped through post implantation process. The possible dopants include boron for SiGe, carbon for Si, phosphorous for Si, or SiCP. For example, a SiGe epitaxy process includes a growth temperature range of 500° C.-700° C., and a pressure range of 5-150 torr. A Si epitaxy growth condition includes a growth temperature range of 550° C.-750° C., and a pressure range of 5-200 torr.

In an embodiment, a first void 1112A(1), 1112B(1) formed adjacent to the receded semiconductor nanowire strip 214RC, 212RC, respectively, has a substantially same profile as a second void 1112A(2), 1112B(2) formed adjacent to the semiconductor nanowire strip 214, 212, respectively.

In an embodiment, as shown in FIG. 11D, in a scenario that a receded sacrificial strip, here 212SR, is formed between the topmost receded nanowire strip, here 212RC, and the sacrificial gate structure 310, the semiconductor layer 1110, here 1110B, does not extend to the spacer 320 and there is a void 1114 formed between the semiconductor layer 1110B and the outer spacer 320 and the inner spacer 610B.

In an embodiment, as shown in FIG. 11C, in a scenario that the topmost receded nanowire strip, here 214RC, is adjacent to the sacrificial gate structure 310, the semiconductor layer 1110, here 1110A, is formed adjacent to the topmost receded nanowire strip 214RC and extends upward beyond the topmost receded nanowire strip 214RC until reaching the outer spacer 320. There is no gap/void between the semiconductor layer 1110A and the outer spacer 320.

In an embodiment, the semiconductor layers 1110A, 1110B may be formed by epitaxy process. The semiconductor layers 1110A is silicon phosphide (SiP) or other suitable semiconductor materials. The semiconductor layer 1110B is silicon germanium (SiGe) or other suitable semiconductor materials. The semiconductor layers 1110 (1110A, 1110B) may be doped in various approaches with various dopants/ impurities, like arsenic, phosphorous, boron, gallium, indium, antimony, oxygen, nitrogen, or various combinations thereof. In an embodiment, the semiconductor layers 1110A, 1110B are doped with dopants of different conductivity types, i.e., either P type or N type. In a further embodiment, the semiconductor layer 1110A, 1110B may be doped with a same type of dopants but with different doping concentrations.

As shown in FIGS. 11B' and 11D, with the dielectric layer 612B, the semiconductor layer 1110B does not contact the substrate 110 or more specifically the lower portion 206B of the fin structure 202B, which is made from the silicon substrate no and has a different semiconductor material from the semiconductor nanowire strips 212 of the nanowire stack 210B. FIGS. 11B' and 11D show that the semiconductor layer 1110B is not formed adjacent to the lower portion 206B of the fin structure 202B, as an example embodiment. In other embodiments, the semiconductor layer 1110B may be formed adjacent to the lower portion 206B of the fin structure 202B and the dielectric layer 612B functions to prevent unexpected charge carrier movement through the lower portion 206B of silicon, which is different from the semiconductor nanowire strip 212 of silicon germanium in the nanowire stack 210B.

As shown in FIGS. 11B' and 11C, in the scenario that the substrate 110, or more specifically the lower fin portion 206A, includes a same semiconductor material, here silicon, as the semiconductor nanowire strip 214/214RC of the nanowire stack 210A, the semiconductor layer 1110A contacts the lower portion 206A.

In example operation 1380, with reference also to FIGS. 12A-12D, the sacrificial gate structure 310 and the receded sacrificial strips 212SR, 214SR and a part of the receded substrate portion 530 are removed and a replacement gate structure 1210 is formed in the vacated space after the removal of the sacrificial gate structure 310, the receded sacrificial strips 212SR, 214SR, and the part of the receded substrate portion 530. The replacement gate structure 1210 may include a gate electrode 1212, a gate dielectric 1214, an optional interfacial dielectric layer 1216 and a gate cap (not shown for simplicity).

The gate electrode 1212 includes a conductive material, e.g., a metal or a metal compound. Suitable metal materials for the gate electrode 1212 include ruthenium, palladium, platinum, cobalt, nickel, and/or conductive metal oxides and other suitable P type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N type metal materials. In some examples, the gate electrode 1212 includes a work function layer tuned to have a proper work function for enhanced performance of the field effect transistor devices. For example, suitable N type work function metals include Ta, TiAl, TiAlN, TaCN, other N type work function metal, or a combination thereof, and suitable P type work function metal materials include TiN, TaN, other p-type work function metal, or combination thereof. In some examples, a conductive layer, such as an aluminum layer, is formed over the work function layer such that the gate electrode 1212 includes a work function layer disposed over the gate dielectric 1214 and a conductive layer disposed over the work function layer and below the gate cap. In an example, the gate electrode 1212 has a thickness ranging from about 5 nm to about 40 nm depending on design requirements.

The optional interfacial dielectric layer 1116, e.g., thermal or chemical oxide, may have a thickness ranging from about 5 to about 10 angstrom (Å).

In example embodiments, the gate dielectric layer 1214 includes a high dielectric constant (high K) dielectric material selected from one or more of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. A high K dielectric material, in some applications, may include a dielectric constant (K) value larger than 6. Depending on design requirements, a dielectric material of a dielectric contact (K) value of 9 or higher may be used. The high K dielectric layer 1214 may be formed by atomic layer deposition (ALD) or other suitable technique. In accordance with embodiments described herein, the high K dielectric layer 1214 includes a thickness ranging from about 10 to about 30 angstrom (Å) or other suitable thickness.

Formed within the vacated space by the removal of the receded sacrificial nanowire strips 212SR, 214SR, and the receded substrate portion 530, the replacement gate structure 1210 wraps around the semiconductor nanowire strips 214, 214RC, 212, 212RC of the nanowire stack 210A, 210B, respectively. FIGS. 12A-12D show, as an illustrative example, that only the gate dielectric layer 1214 and the interfacial dielectric layer 1116 wrap around all the upper, lower and side surfaces of each of the semiconductor nanowire strips 214, 214RC, 212, 212RC of the nanowire stack 210A, 210B, respectively. This illustrative example is not limiting. The gate electrode 1212 also may be formed wrapping around all the upper, lower and side surfaces of each of the semiconductor nanowire strips 214, 214RC, 212, 212RC.

Figure 12B:
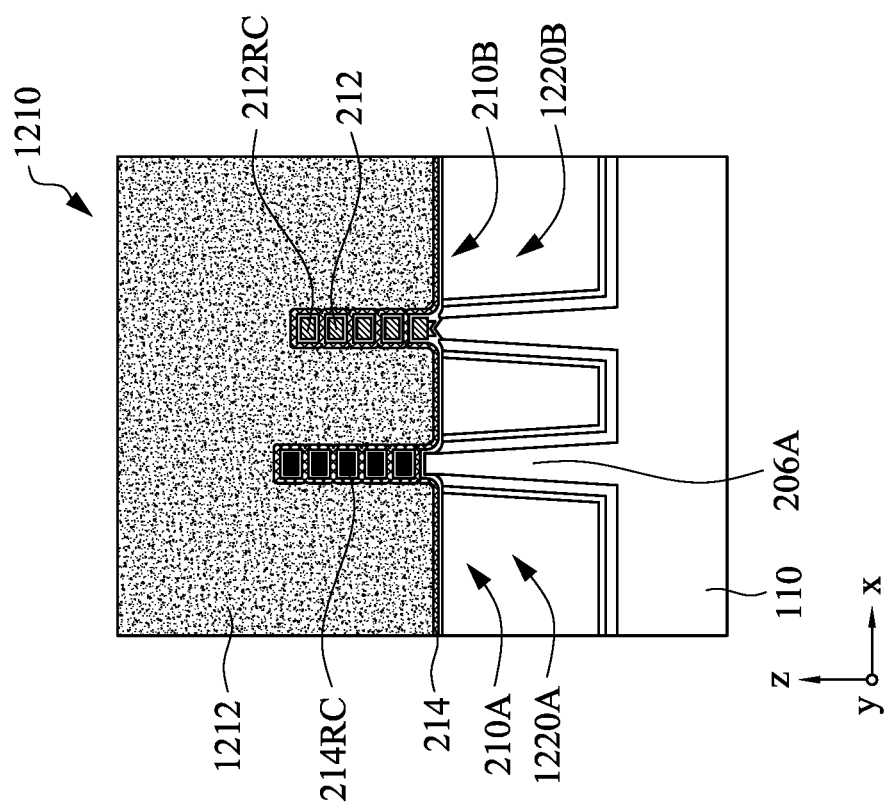
Figure 12A:
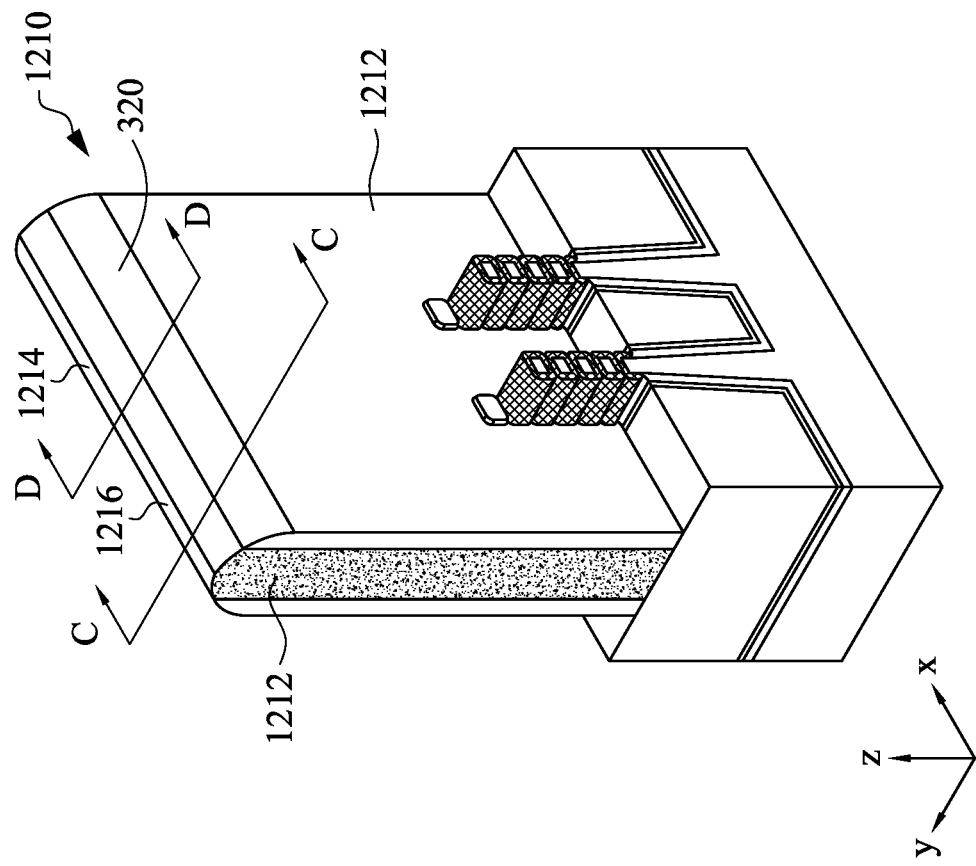
Figure 12D:
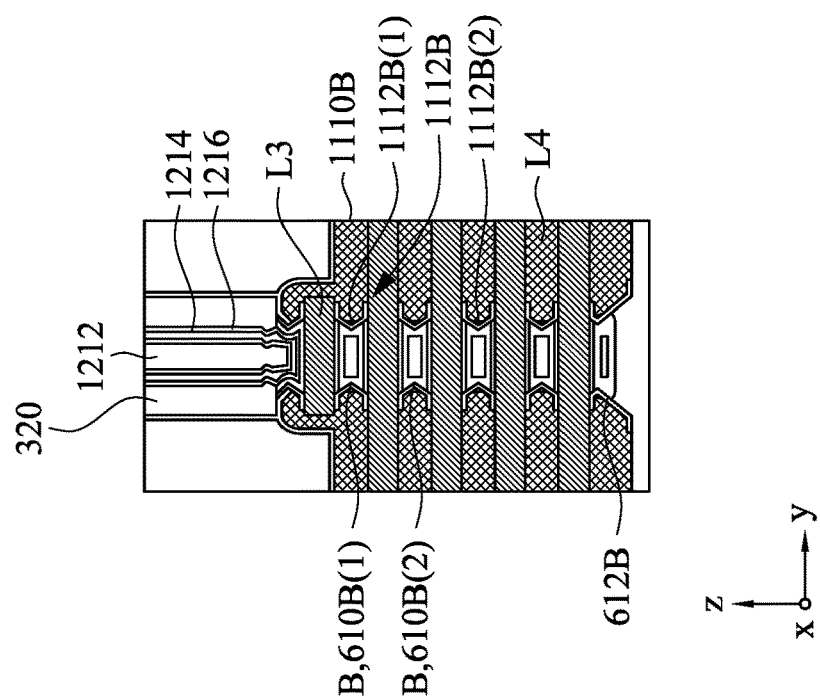
Figure 12C:
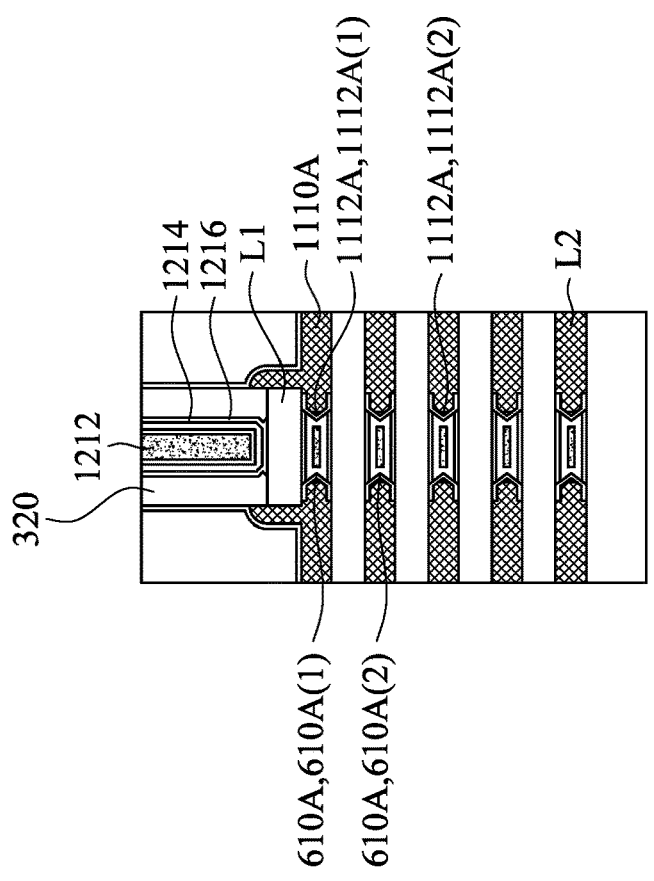

As shown in FIGS. 12C and 12D, the replacement gate structure 1210 is separated from the semiconductor layers 1110 (1110A, 1110B) by the inner spacers 610 (610A, 610B) and the void 1112 (1112A, 1112B). The semiconductor layers 1110 (1110A, 1110B) wrap around the semiconductor nanowire strips 214, 212, respectively and are adjacent to the receded semiconductor nanowire strip 214RC, 212RC, respectively.

In accordance with embodiments of the present disclosure, the semiconductor layers 1110 (1110A, 1110B) are configured as the source/drain region of a FET device. At least part of the semiconductor nanowire strips 212, 212RC, 214, 214RC that adjacent to the gate 1210 are configured as channels region(s) of the FET devices.

Device 1220A, resulting from the nanowire stack 210A, includes a substrate 110 including the lower fin portion 206A and a stack of semiconductor nanowire strips 214, 214RC over the substrate 110. The stack of the semiconductor nanowire strips 214, 214RC include one or more receded nanowire strip 214RC and one or more nanowire strips 214 each of 1-D nanowire silicon. A length L1 of the receded nanowire strip 214RC is smaller than a length L2 of a nanowire strip 214, which is not receded. FIG. 12C shows that the length L2 is larger than the length L1. However, FIG. 12C does not show the full length of the non-receded silicon nanowire strip 214. The nanowire strips 214 are positioned lower than the receded nanowire strip 214RC. A source/drain structure 1110A is adjacent to the receded nanowire strip 214RC and wraps around a (first) portion of each of the semiconductor nanowire strips 214 outside the inner spacer 610A. The gate structure 1210 wraps around a (second portion) of each of the receded nanowire strip(s) 214RC and the lower nanowire strip(s) 214 positioned within or inside the inner spacer 610A. The inner spacer 610A is positioned laterally between the source/drain structure 1110A and the gate structure 1210. The inner spacer structure 610A includes the first inner spacer segment 610A(1) adjacent to the receded nanowire strip 214RC and the second inner spacer segment 610A(2) adjacent to the lower nanowire strip 214. In accordance with disclosed embodiments, the first inner spacer segment 610A(1) and the second inner spacer segment 610A(2) have a substantially same profile.

In accordance with disclosed embodiments, a void 1112A is formed between the source/drain structure 1110A and the inner spacer 610A. A first void 1112A(1) between the source/drain structure 1110A and the first inner spacer segment 610A(1) and a second void 1112A(2) between the source/drain structure 1110A and the second inner spacer segment 610A(2) have substantially a same shape or profile.

In an embodiment, the device 1220A is configured as an nMOS with silicon nanowire strips 214, 214RC and S/D structures 1110A of SiP, SiC or SiCP.

Device 1220B, resulting from the nanowire stack 210B, includes a substrate 110 including the lower fin portion 206B and a stack of semiconductor nanowire strips 212, 212RC over the substrate 110. The stack of semiconductor nanowire strips 212, 212RC include one or more receded nanowire strip 212RC on the top and one or more lower nanowire strips 212, each of 1-D nanowire silicon germanium. A length L3 of the receded nanowire strip 212RC is smaller than a length L4 of a nanowire strip 212, which is not receded. FIG. 12D shows that the length L4 is larger than the length L2. However, FIG. 12D does not show the full length of the non-receded silicon germanium nanowire strip 212. The nanowire strips 212 are positioned lower than the receded nanowire strip 212RC. A source/drain structure 1110B wraps around each of the semiconductor nanowire strip 212 and is adjacent to a (first portion) of the receded nanowire strip 212RC outside the inner spacer 610B. The gate structure 1210 wraps around a (second) portion of each of the receded nanowire strip(s) 212RC and the lower nanowire strip(s) 212 within or inside of the inner spacer 610B. The inner spacer 610B is positioned laterally between the source/drain structure 1110B and the gate structure 1210. The inner spacer structure 610B including the first inner spacer segment 610B(1) adjacent to the receded nanowire strip 212RC and the second inner spacer segment 610B(2) adjacent to the lower nanowire strip 212. In various embodiments disclosed herein, the first inner spacer segment 610B(1) and the second inner spacer segment 610B(2) have a substantially sameshape/profile.

In accordance with various embodiments of the present disclosure, a void 1112B is formed between the source/drain structure 1110B and the inner spacer 610B. A first void 1112B(1) between the source/drain structure 1110B and the first inner spacer segment 610B(1) and a second void 1122B(2) between the source/drain structure 1110B and the second inner spacer segment 610B(2) have substantially a same shape or profile.

In various embodiments of the device 1220B, the source/drain structure 1110B does not fully wrap up the lowest semiconductor nanowire strip 212. Instead, a surface or a portion of the surface of the lowest semiconductor nanowire strip 212 is covered by the dielectric layer 612B that separates the lowest semiconductor nanowire strip 212 from the substrate 110.

In an embodiment, the device 1220B is configured as a pMOS with silicon germanium nanowire strips 212, 212RC and S/D structures 110B of SiGe or SiGeB.

In the disclosure herein, the devices 1220A, 1220B are illustrated as being positioned side by side and being made together as complementary devices, which is not limiting. Embodiments of processes and/or structures in accordance with the present disclosure may be used to make a single type of device.

In accordance with embodiments disclosed herein, with the devices 1220A, 1220B positioned side by side over the substrate 110, the topmost receded semiconductor nanowire strip 214RC of the device 1220A is not at a same level as, here higher than, the topmost receded semiconductor nanowire strip 212RC of the device 1220B.

With the inner spacers 610 and voids 1112 formed in accordance with the various embodiments described herein, the electrostatic characteristics of the devices 1220A, 1220B are improved, which will lead to widespread acceptance and adoption of nanowire FET devices in sub-7 nm applications.

The present disclosure may be further appreciated with the description of the following embodiments:

In an embodiment, a device includes a substrate no and a stack 210 of nanowire structures 212, 214 over the substrate. The stack of nanowire structures including a topmost nanowire structure 212RC, 214RC and a lower nanowire structure 212, 214 that is stacked lower than the topmost nanowire structure 212RC, 214RC with respect to the substrate. A length of the topmost nanowire structure 212RC, 214RC is less than a length of the lower nanowire structure 212, 214. A source/drain structure 1110 is adjacent to the topmost nanowire structure 212RC, 214RC and wraps around a first portion of the lower nanowire structure 212, 214. A gate structure 1210 wraps around the topmost nanowire structure 212RC, 214RC and wraps around a second portion of the lower nanowire structure 212, 214. An inner spacer structure 610 is positioned laterally between the source/drain structure 1110 and the gate structure 1210. The inner spacer structure 610 including a first inner spacer segment adjacent to the topmost nanowire structure and a second inner spacer segment adjacent to the lower nanowire structure. The first inner spacer segment and the second inner spacer segment have substantially a same shape.

In another embodiment, a device includes a substrate no and a first transistor 1220A and a second transistor 1220B over the substrate. Each of the first transistor and the second transistor includes a stack 210 of nanowire structures 212, 214 over the substrate. The stack of nanowire structures including a topmost nanowire structure 212RC, 214RC and a lower nanowire structure 212, 214 that is stacked lower than the topmost nanowire structure 212RC, 214RC with respect to the substrate. A length of the topmost nanowire structure 212RC, 214RC is less than a length of the lower nanowire structure 212, 214. A source/drain structure 1110 is adjacent to the topmost nanowire structure 212RC, 214RC and wraps around a first portion of the lower nanowire structure 212, 214. A gate structure 1210 wraps around the topmost nanowire structure 212RC, 214RC and wraps around a second portion of the lower nanowire structure 212, 214. The topmost nanowire structure 214RC of the first transistor 1220A is at a different level from the topmost nanowire structure 212RC of the second transistor 1220B.

In further embodiments, a method includes receiving a wafer, the wafer including a stack of epitaxy layers over a substrate, the stack of epitaxy layers including a plurality of semiconductor epitaxy layers and a plurality of sacrificial epitaxy layers stacked in an alternating manner. A fin structure is formed, which includes a stack of strips orientated in a first direction by patterning the stack of epitaxy layer, the stack of strips including a plurality of semiconductor strips and a plurality of sacrificial strips. A gate structure is formed over the fin structure. A receded semiconductor strip is formed by removing portions of a topmost semiconductor strip of the semiconductor strips such that a length of the topmost semiconductor strip is shorter than a length of a bottommost semiconductor strip of the semiconductor strips. Receded sacrificial strips are formed by removing portions of the plurality of sacrificial strips, the receded sacrificial strips each including recessed edge surfaces. An inner spacer is formed adjacent to the recessed edge surfaces of the receded sacrificial strips. A source/drain structure is formed adjacent to the inner spacer and the plurality of semiconductor strips.

The invention claimed is:

1. A method of forming a semiconductor device, the method comprising:
    forming a first fin structure over a substrate, the first fin structure including alternating layers of a first semiconductor material layer and a second semiconductor material layer;
    forming a gate structure over the first fin structure;
    forming a receded strip by removing portions of a topmost layer of the second semiconductor material layer on opposing sides of the gate structure, wherein, after forming the receded strip, a lower layer of the second semiconductor material layer has a first length, wherein a second length of the receded strip is less than the first length, wherein the lower layer of the second semiconductor material layer is below the topmost layer of the second semiconductor material layer;
    forming receded sacrificial strips by removing portions of the first semiconductor material layers on opposing sides of the gate structure, the receded sacrificial strips each including recessed edge surfaces;
    forming an inner spacer adjacent to the recessed edge surfaces of the receded sacrificial strips; and
    epitaxially growing a source/drain structure adjacent to the inner spacer and remaining portions of the alternating layers of the first semiconductor material layer and the second semiconductor material layer.

2. The method of claim 1, wherein the source/drain structure extends around remaining ones of the second semiconductor material layers.

3. The method of claim 1, wherein after epitaxially growing the source/drain structure a void is interposed between the source/drain structure and at least one of the receded sacrificial strips.

4. The method of claim 1, further comprising:
    removing the gate structure;
    removing the receded sacrificial strips in a channel region; and
    forming a replacement gate structure around remaining ones of the second semiconductor material layers.

5. The method of claim 4, wherein after forming the replacement gate structure a void is interposed between the source/drain structure and the replacement gate structure.

6. The method of claim 1, wherein the source/drain structure directly contacts the receded strip.

7. The method of claim 1, wherein forming the inner spacer comprises:
    forming a dielectric layer adjacent to the receded sacrificial strips and the receded strip;
    forming an etch stop layer selectively covering first portions of the dielectric layer adjacent the receded sacrificial strips;
    removing second portions of the dielectric layer free of the etch stop layer; and
    removing the etch stop layer.

8. A method of forming a semiconductor device, the method comprising:
    forming a first fin structure over a substrate, the first fin structure including alternating layers of a first semiconductor material and a second semiconductor material;
    forming a gate structure over the first fin structure;
    forming a first receded strip by removing portions of a topmost layer of the second semiconductor material on opposing sides of the gate structure;
    forming receded sacrificial strips by removing portions of the first semiconductor material on opposing sides of the gate structure, the receded sacrificial strips each including recessed edge surfaces;
    forming an inner spacer layer adjacent to the recessed edge surfaces of the receded sacrificial strips, the inner spacer layer extending over upper surfaces of at least a first layer of the second semiconductor material, the first layer being below the topmost layer of the second semiconductor material;
    forming etch stop portions over the inner spacer layer adjacent the recessed edge surfaces of the receded sacrificial strips, exposed portions of the inner spacer layer extending away from the etch stop portions;
    removing the exposed portions of the inner spacer layer, remaining portions of the inner spacer layer forming inner spacers; and forming a source/drain structure adjacent to the inner spacer and the layers of the second semiconductor material.

9. The method of claim 8, wherein forming the source/drain structure comprises:
epitaxially growing a semiconductor material around the layers of the second semiconductor material.

10. The method of claim 8, wherein the source/drain structure directly contacts the first receded strip.

11. The method of claim 8, wherein forming the source/drain structure forms a void between the source/drain structure and the receded sacrificial strips.

12. The method of claim 8, further comprising:
removing the gate structure;
removing at least portions of the receded sacrificial strips; and
forming a replacement gate structure adjacent the layers of the second semiconductor material.

13. The method of claim 12, wherein a width of the replacement gate structure is less than a width of the first receded strip.

14. The method of claim 8, further comprising, prior to forming the receded sacrificial strips, forming a second receded strip by removing portions of a topmost layer of the first semiconductor material on opposing sides of the gate structure.

15. A method of forming a semiconductor device, the method comprising:
forming a first fin structure over a substrate, the first fin structure including alternating layers of a first semiconductor material and a second semiconductor material;
forming a gate structure over the first fin structure;
forming receded sacrificial strips by removing portions of the first semiconductor material on opposing sides of the gate structure, the receded sacrificial strips each including recessed edge surfaces;
forming an inner spacer layer adjacent to the recessed edge surfaces of the receded sacrificial strips and over the layers of the second semiconductor material;
forming etch stop portions over the inner spacer layer adjacent the recessed edge surfaces of the receded sacrificial strips;
removing exposed portions of the inner spacer layer, remaining portions of the inner spacer layer forming inner spacers adjacent the recessed edge surfaces of the receded sacrificial strips; and
forming a source/drain structure adjacent to the inner spacer and the layers of the second semiconductor material.

16. The method of claim 15, prior to forming the inner spacer layer, forming a first receded strip by removing portions of an uppermost layer of the alternating layers.

17. The method of claim 15, prior to forming the inner spacer layer, forming a first receded strip and a second receded strip by removing portions of uppermost layers of the first semiconductor material and the second semiconductor material.

18. The method of claim 15, further comprising:
removing the gate structure;
removing at least portions of the receded sacrificial strips; and
forming a replacement gate structure adjacent the layers of the second semiconductor material, wherein a void is interposed between the source/drain structure and the replacement gate structure.

19. The method of claim 18, wherein the void is interposed between the source/drain structure and the inner spacers.

20. The method of claim 18, wherein after forming the replacement gate structure the void is interposed between the source/drain structure and the inner spacers.

* * * * *